(12) United States Patent
Kozuka et al.

(10) Patent No.: US 9,945,890 B2
(45) Date of Patent: Apr. 17, 2018

(54) METHOD FOR MONITORING POWER AND POWER MONITORING APPARATUS

(71) Applicant: Panasonic Intellectual Property Corporation of America, Torrance, CA (US)

(72) Inventors: Masayuki Kozuka, Osaka (JP); Motoji Ohmori, Osaka (JP); Takako Hirose, Kyoto (JP)

(73) Assignee: PANASONIC INTELLECTUAL PROPERTY CORPORATION OF AMERICA, Torrance, CA (US)

( * ) Notice: Subject to any disclaimer, the term of this patent is extended or adjusted under 35 U.S.C. 154(b) by 447 days.

(21) Appl. No.: 14/601,622

(22) Filed: Jan. 21, 2015

(65) Prior Publication Data

US 2015/0212125 A1 Jul. 30, 2015

(30) Foreign Application Priority Data

Jan. 24, 2014 (JP) ................. 2014-011561

(51) Int. Cl.
*G01R 21/133* (2006.01)
(52) U.S. Cl.
CPC ................. *G01R 21/133* (2013.01)
(58) Field of Classification Search
CPC ....... G01R 21/133; G01R 21/00; G01D 4/002
USPC ......... 702/64, 60, 61; 340/3.1; 700/295, 291
See application file for complete search history.

(56) References Cited

U.S. PATENT DOCUMENTS

| 2009/0195349 | A1* | 8/2009 | Frader-Thompson | G01D 4/002 340/3.1 |
| 2012/0290144 | A1 | 11/2012 | Yuasa et al. | |
| 2014/0018969 | A1* | 1/2014 | Forbes, Jr. | H02J 3/32 700/295 |

FOREIGN PATENT DOCUMENTS

JP  2011-159051  8/2011

* cited by examiner

*Primary Examiner* — John H Le
(74) *Attorney, Agent, or Firm* — Greenblum & Bernstein, P.L.C.

(57) ABSTRACT

In a method for monitoring power, preset information that defines periods in which one or more preset electric devices are scheduled to operate is received, an amount of power available, which is an estimated amount of power available in the building in each period, is calculated, estimated power consumption, which is estimated power consumption in the building in each period, is calculated using power consumption information, to which power consumption of the electric devices to be preset is registered in advance, and the preset information, an alternative instruction with which the estimated power consumption becomes lower than or equal to the amount of power available is generated, and the alternative instruction is displayed on a terminal apparatus. And at least one of the receiving, the calculating the amount of power available, the calculating the estimated power consumption, the generating and the displaying is performed by a processor.

13 Claims, 15 Drawing Sheets

FIG. 9

| DEVICE TYPE ID | OPERATION TIME | INSTRUCTIONS | |
|---|---|---|---|
| FIRST AIR CONDITIONER (LIVING ROOM) | 9/5/2013 STARTS AT 14:00 | COOLING, TEMPERATURE: 28°C, AIR VOLUME: AUTOMATIC, WIND DIRECTION: AUTOMATIC | ⋮ |
| SECOND AIR CONDITIONER (CHILD'S ROOM) | 9/5/2013 STARTS AT 15:00 | COOLING, TEMPERATURE: 26°C, AIR VOLUME: AUTOMATIC, WIND DIRECTION: AUTOMATIC | ⋮ |
| FIRST WASHING MACHINE | 9/5/2013 DRYING ENDS AT 17:00 (WASHING STARTS AT 14:20) | WASHING AND DRYING | ⋮ |
| FIRST ELECTRIC KETTLE | 9/5/2013 BOILING ENDS AT 16:00 (BOILING STARTS AT 15:45) | TEMPERATURE: 100°C, RETAINS AT 98°C | ⋮ |
| BATH WATER HEATER | 9/5/2013 BATH IS READY AT 17:00 (BEGINS TO PREPARE BATH AT 16:15) | TEMPERATURE: 39°C, WATER LEVEL: 4 | ⋮ |
| RICE COOKER | 9/5/2013 COOKING ENDS AT 17:00 (COOKING BEGINS AT 16:20) | FLUFFY MODE | ⋮ |
| MICROWAVE | 9/5/2013 18:00 | HEATS FOR 5 MINUTES | ⋮ |

FIG. 10

| DEVICE TYPE | POWER CONSUMPTION | |
|---|---|---|
| FIRST AIR CONDITIONER | STANDARD MODEL AT 28°C<br>CHANGE IN TEMPERATURE<br>CHANGE IN AIR VOLUME | 90 W<br>50 W<br>20 W |
| SECOND AIR CONDITIONER | LARGE MODEL AT 28°C<br>CHANGE IN TEMPERATURE<br>CHANGE IN AIR VOLUME | 550 W<br>60 W<br>25 W |
| FIRST WASHING MACHINE | WASHING<br>DRYING | 445 W<br>1150 W |
| FIRST ELECTRIC KETTLE | BOILING<br>HEAT RETAINING | 1100 W<br>35 W |
| BATH WATER HEATER | HEATING<br>HEAT RETAINING | 2000 W<br>65 W |
| RICE COOKER | COOKING<br>HEAT RETAINING | 600 W<br>24 W |
| MICROWAVE | HEATING | 1450 W |
| ... | ... | |

FIG. 11

| DEVICE TYPE | PRIORITY | NEXT BEST OPERATION |
|---|---|---|
| FIRST AIR CONDITIONER | B | ACCELERATED OPERATION BEFORE PEAK |
| SECOND AIR CONDITIONER | A | CANCEL |
| FIRST WASHING MACHINE | A | ACCELERATED OPERATION BEFORE PEAK |
| FIRST ELECTRIC KETTLE | A | ACCELERATED OPERATION BEFORE PEAK |
| BATH WATER HEATER | A | ACCELERATED OPERATION BEFORE PEAK |
| RICE COOKER | B | ACCELERATED OPERATION BEFORE PEAK |
| MICROWAVE | A | CANCEL |

FIG. 12

| DEVICE TYPE ID | SET TIME | POWER CONSUMPTION | | PRIORITY | NEXT BEST OPERATION |
|---|---|---|---|---|---|
| FIRST AIR CONDITIONER (LIVING ROOM) | 9/5/2013 STARTS AT 14:00 | STANDARD MODEL AT 28°C | 90 W | B | ACCELERATED OPERATION BEFORE PEAK |
| SECOND AIR CONDITIONER (CHILD'S ROOM) | 9/5/2013 STARTS AT 15:00 | LARGE MODEL AT 28°C | 550 W | A | CANCEL |
| FIRST WASHING MACHINE | 9/5/2013 DRYING ENDS AT 17:00 (WASHING STARTS AT 14:20) | WASHING DRYING | 445 W 1150 W | A | ACCELERATED OPERATION BEFORE PEAK |
| FIRST ELECTRIC KETTLE | 9/5/2013 BOILING ENDS AT 16:00 (BOILING STARTS AT 15:45) | BOILING HEAT RETAINING | 1100 W 35 W | A | ACCELERATED OPERATION BEFORE PEAK |
| BATH WATER HEATER | 9/5/2013 BATH IS READY AT 17:00 (BEGINS TO PREPARE BATH AT 16:15) | HEATING HEAT RETAINING | 2000 W 65 W | A | ACCELERATED OPERATION BEFORE PEAK |
| RICE COOKER | 9/5/2013 COOKING ENDS AT 17:00 (COOKING BEGINS AT 16:20) | COOKING HEAT RETAINING | 600 W 24 W | B | ACCELERATED OPERATION BEFORE PEAK |
| MICROWAVE | 9/5/2013 18:00 | HEATING | 1450 W | A | CANCEL |

FIG. 13

| TARGET PERIOD | AMOUNT OF POWER TO BE SUPPRESSED |
|---|---|
| 15:00 – 15:30 | 1800 W |
| 15:30 – 16:00 | 1000 W |
| 16:00 – 16:30 | 800 W |

| | |
|---|---|
| [S802] | EXTRACT SECOND AIR CONDITIONER AND FIRST WASHING MACHINE (DRYING OPERATION). |
| [S803] | SUM OF POWER CONSUMPTION = 550 + 1,150 = 1,700 |
| [S804] | SUM OF POWER CONSUMPTION 1,700 < AMOUNT OF POWER TO BE SUPPRESSED 1,800 |
| [S810 (FIRST LOOP)] | DETERMINE SECOND AIR CONDITIONER AND FIRST WASHING MACHINE (DRYING OPERATION) AS ELECTRIC DEVICE TO BE CHANGED. |
| [S811 (FIRST LOOP)] | NEXT BEST OPERATION IS ACCELERATED OPERATION OF FIRST WASHING MACHINE (DRYING OPERATION) (DRYING ENDS AT 15:00 [WASHING STARTS AT 12:20]). |
| [S810 (SECOND LOOP)] | DETERMINE FIRST AIR CONDITIONER AS ELECTRIC DEVICE TO BE CHANGED (NO ROOM). |
| [S811 (SECOND LOOP)] | NEXT BEST OPERATION IS TO START FIRST AIR CONDITIONER AT 13:30 AND TEMPORARILY STOP FIRST AIR CONDITIONER AT 15:00. |
| [S809] | DETERMINE INFORMATION REGARDING S810 (FIRST AND SECOND LOOPS) AND S811 (FIRST AND SECOND LOOPS) AS ALTERNATIVE INSTRUCTIONS AND PROCESS ENDS. |

| | |
|---|---|
| [S802] | EXTRACT SECOND AIR CONDITIONER, FIRST WASHING MACHINE (DRYING OPERATION), AND FIRST ELECTRIC KETTLE. |
| [S803] | SUM OF POWER CONSUMPTION = 550 + 1,150 + 1,100 = 2,800 |
| [S804] | SUM OF POWER CONSUMPTION 2,800 > AMOUNT OF POWER TO BE SUPPRESSED 1,000 |
| [S805] | ROOM = 2,800 - 1,000 = 1,800 |
| [S807] | COMBINATION: IN THIS CASE, IT IS SUFFICIENT THAT EITHER FIRST WASHING MACHINE OR FIRST ELECTRIC KETTLE BE CHANGED. |
| [S808] | NEXT BEST OPERATION IS ACCELERATED OPERATION OF FIRST WASHING MACHINE (WASHING STARTS AT 12:20 AND ENDS AT 15:00) OR ACCELERATED OPERATION OF FIRST ELECTRIC KETTLE (STARTS AT 14:45 AND ENDS AT 15:00). |
| [S809] | DETERMINE INFORMATION REGARDING S807 AND S808 AS ALTERNATIVE INSTRUCTIONS AND PROCESS ENDS. |

[S802] EXTRACT SECOND AIR CONDITIONER, FIRST WASHING MACHINE (DRYING OPERATION), FIRST ELECTRIC KETTLE (HEAT-RETAINING OPERATION), AND BATH WATER HEATER.
[S803] SUM OF POWER CONSUMPTION = 550 + 1,150 + 35 + 2,000 = 3,735
[S804] SUM OF POWER CONSUMPTION 3,735 > AMOUNT OF POWER TO BE SUPPRESSED 800
[S805] ROOM = 3,735 - 800 = 2,935
[S807] COMBINATION: IN THIS CASE, IT IS SUFFICIENT THAT EITHER FIRST WASHING MACHINE OR BATH WATER HEATER BE CHANGED.
[S808] NEXT BEST OPERATION IS ACCELERATED OPERATION OF FIRST WASHING MACHINE (WASHING STARTS AT 12:20 AND ENDS AT 15:00) OR ACCELERATED OPERATION OF BATH WATER HEATER (STARTS AT 14:15 AND ENDS AT 15:00).
[S809] DETERMINE INFORMATION REGARDING S807 AND S808 AS ALTERNATIVE INSTRUCTIONS AND PROCESS ENDS.

METHOD FOR MONITORING POWER AND POWER MONITORING APPARATUS

CROSS REFERENCES TO RELATED APPLICATIONS

This application claims priority to Japanese Patent Application No. 2014-011561, filed on Jan. 24, 2014, the contents of which are hereby incorporated by reference.

BACKGROUND

1. Technical Field

The present disclosure relates to techniques for monitoring the power demand of electric devices installed in a building.

2. Description of the Related Art

Currently, a technique for monitoring the power demand of electric devices installed in a user's house and determining whether power saving is necessary is known. For example, in Japanese Unexamined Patent Application Publication No. 2011-159051, a technique for determining, if private power generation becomes lower than the amount of power purchased, that power saving is necessary, generating a suggestion about the power saving, providing the suggestion to a user, and, if the user accepts the suggestion, operating the electric devices in accordance with the suggestion is disclosed.

SUMMARY

In one general aspect, the techniques disclosed here feature a method for monitoring power used by a power monitoring system that monitors power demand of electric devices installed in a building. The method includes receiving preset information that defines periods in which one or more preset electric devices are scheduled to operate, calculating an amount of power available, which is an estimated amount of power available in the building in each period, calculating estimated power consumption, which is estimated power consumption in the building in each period, using power consumption information, to which power consumption of the electric devices to be preset is registered in advance, and the preset information, generating an alternative instruction with which the estimated power consumption becomes lower than or equal to the amount of power available, and displaying the alternative instruction on a terminal apparatus. And at least one of the receiving, the calculating the amount of power available, the calculating the estimated power consumption, the generating and the displaying is performed by a processor.

According to the present disclosure, whether power saving will be necessary in each period in which electric devices are scheduled to operate can be determined in advance, and if power saving will be necessary, it is possible to display information regarding the power saving on a terminal apparatus. As a result, by changing in advance instructions given to the electric devices, a user who has seen the information displayed on the terminal apparatus can avoid a situation in which the preset electric devices do not operate due to insufficient power.

These general and specific aspects may be implemented using a system, a method, and a computer program, and any combination of systems, methods, and computer programs.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF THE DRAWINGS

FIG. 9 is a diagram illustrating an example of the data structure of preset information;

FIG. 10 is a diagram illustrating an example of the data structure of power consumption information;

FIG. 11 is a diagram illustrating an example of the data structure of priority information;

FIG. 12 is a diagram illustrating the example of the preset information and the example of the priority information;

FIG. 13 is a diagram illustrating exceeding periods and the amount of power to be suppressed in each period;

FIG. 14 is a diagram illustrating an example of a process for generating alternative instructions in a period of 15:00 to 15:30;

FIG. 15 is a diagram illustrating an example of a process for generating alternative instructions in a period of 15:30 to 16:00;

FIG. 16 is a diagram illustrating an example of a process for generating alternative instructions in a period of 16:00 to 16:30;

DETAILED DESCRIPTION

Figure 1:
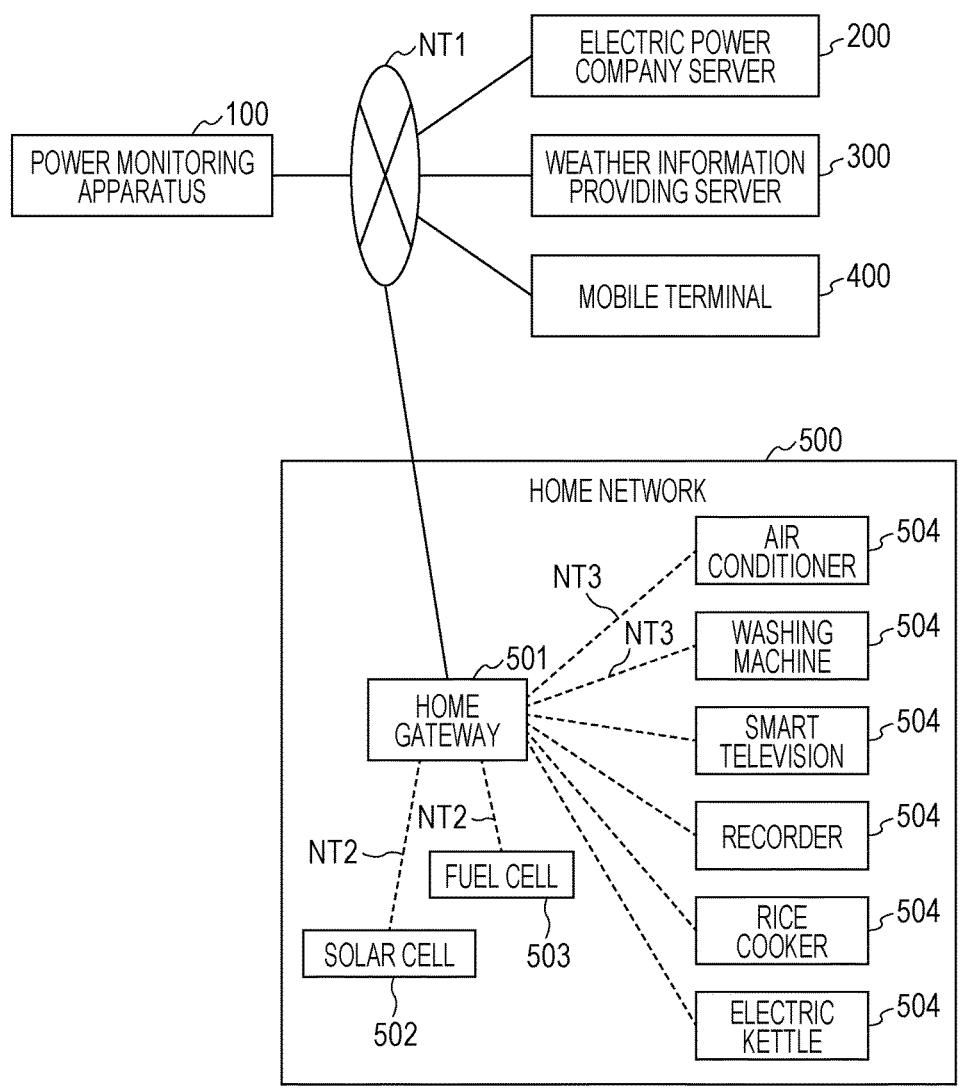
FIG. 1 is a diagram illustrating an example of the overall configuration of a power monitoring system according to a first embodiment.

Details of Realization of Aspect of Present Disclosure

In recent years, cloud services have been proposed in which a user presets electric devices, using a mobile terminal, to operate the electric devices at particular times in accordance with the user's instructions.

If the electric devices operate in accordance with the user's instructions, the power consumption of the electric devices might exceed the amount of power available in the user's house, since the amount of alternating-current (AC) power supplied from an electric power company is limited. In this case, not all the preset electric devices can operate, which is problematic.

In order to avoid this problem, a cloud service can change the user's instructions and enable all the electric devices to operate.

In order to realize this, however, temporal changes in the amount of power available needs to be estimated because the amount of AC power supplied varies depending on the season or the time period of a day. Current cloud services, however, do not estimate temporal changes in the amount of power available.

In addition, if a cloud service forcibly changes the user's instructions, the electric devices operate at times different from those determined by the user, which is problematic. Therefore, if the user's instructions are changed, a unit that notifies the user of the changes needs to be provided.

In addition, with the advent of smart homes, many users now install private generators such as solar cells and fuel cells in their houses. Therefore, temporal changes in the power generation of a private generator need to be taken into consideration in order to estimate the amount of power available. That is, if the user's instructions are changed in consideration of only the AC power without taking into consideration private power generation, it might be incorrectly determined that the amount of power available will be insufficient and the user's instructions might be changed, even if all the electric devices can operate in accordance with the user's instructions using the power generated by the private generator. In this case, the electric devices do not operate in accordance with the user's instructions.

In smart homes, equipment such as solar cells and fuel cells is connected to an equipment network, which is constructed around a smart distribution board, and audio-visual (AV) devices such as a television set and home appliances such as a refrigerator are connected to an appliance network, which is constructed around a home gateway. Recently, a communication protocol for communicably connecting the smart distribution board and the home gateway to each other and connecting the equipment to the Internet has been developed. By using this technology, the solar cells and the fuel cells can be connected to a cloud server through the smart distribution board and the home gateway, thereby enabling the cloud server to detect the amount of power generated by the solar cells and the fuel cells.

On the other hand, in the technique disclosed in Japanese Unexamined Patent Application Publication No. 2011-159051, if power saving is necessary, a suggestion about the power saving is provided for a user. If the user accepts the suggestion, electric devices are controlled in accordance with the suggestion. For example, if private power generation becomes lower than AC power and the temperature of an air conditioner is higher than a certain value (for example, 18° C.) with the air conditioner operating in a heating mode, a suggestion, say, "The temperature of the air conditioner is too high. Do you want to turn it down to 18° C.? If you close the curtain, the room gets warmer", is provided for the user. If the user accepts the suggestion, in Japanese Unexamined Patent Application Publication No. 2011-159051, a control command to decrease the temperature of the air conditioner to 18° C. is transmitted to the air conditioner and a control command to close the curtain is transmitted to the curtain.

In Japanese Unexamined Patent Application Publication No. 2011-159051, however, whether power saving is currently necessary is determined, but whether power saving will be necessary in the future is not determined. Therefore, it is difficult to determine whether power will become insufficient when the preset electric devices begin to operate.

In addition, in Japanese Unexamined Patent Application Publication No. 2011-159051, a suggestion about the current necessity of power saving is provided for the user, but a suggestion about changes made to the user's instructions is not provided for the user.

One non-limiting and exemplary embodiment provides a method for monitoring power and a power monitoring apparatus capable of estimating temporal changes in the amount of power available in a building, determining in advance whether power saving will be necessary in each period in which electric devices are scheduled to operate, and, if power saving will be necessary, displaying information regarding the power saving on a terminal apparatus.

The method for monitoring power according to an aspect of the present disclosure is a method for monitoring power used by a power monitoring system that monitors power demand of electric devices installed in a building. The method comprising receiving preset information that defines periods in which one or more preset electric devices are scheduled to operate, calculating an amount of power available, which is an estimated amount of power available in the building in each period, calculating estimated power consumption, which is estimated power consumption in the building in each period, using power consumption information, to which power consumption of the electric devices to be preset is registered in advance, and the preset information, generating an alternative instruction with which the estimated power consumption becomes lower than or equal to the amount of power available, and displaying the alternative instruction on a terminal apparatus. And at least one of the receiving, the calculating the amount of power available, the calculating the estimated power consumption, the generating and the displaying may be performed by a processor.

In this case, a user inputs the preset information for presetting the electric devices installed in the building. The amount of power available, which is the estimated amount of power available in the building in each period, is then calculated using power supply information. For example, if each period lasts 30 minutes, the estimated amount of power available until a certain period of time later is calculated at intervals of 30 minutes.

The estimated power consumption, which is the estimated power consumption of the preset electric devices in each period, is then calculated using the power consumption information and the preset information.

The alternative instruction with which the estimated power consumption becomes lower than the amount of power available is then generated, and the generated alternative instruction is displayed on the terminal apparatus.

Therefore, whether or not power saving will be necessary in each period in which the electric devices are scheduled to operate can be determined in advance, and, if power saving will be necessary, information regarding the power saving can be displayed on the terminal apparatus. As a result, by changing in advance instructions given to the electric devices, the user can avoid a situation in which the preset electric devices do not operate due to insufficient power.

In addition, in the method for monitoring power in the present disclosure, in the step of displaying the alternative instruction, a response indicating whether or not to accept the alternative instruction may be received. If a response indicating that the alternative instruction is accepted is received, the preset information may be changed in accordance with the alternative instruction.

In this case, since the preset information is changed using the alternative instruction after the response indicating that the alternative instruction is accepted is received from the user, the instructions indicated by the preset information can be changed after the user accepts the change. Therefore, it is possible to prevent the power monitoring system from changing the instructions without notifying the user of the change.

In addition, in the method for monitoring power in the present disclosure, a private generator may be provided in the building. In the step of calculating the amount of power available, estimated private power generation, which indicates an estimated amount of power generated by the private generator in each period, may be calculated using state information indicating a power generation state of the private generator, an estimated amount of external power, which is an estimated amount of power supplied from an electric power company, is calculated using power supply information provided by the electric power company, and the amount of power available may be calculated by adding the estimated amount of external power to the estimated private power generation.

In this case, if there is a private generator in the building, the amount of power available is calculated while taking into consideration the power generation of the private generator. Therefore, it is possible to avoid determining that, by taking into consideration only the power supplied from the electric power company, power will be insufficient even if power will be sufficient if the power generation of the private generator is taken into consideration. As a result, the electric devices preset by the user might be able to operate.

In addition, in the method for monitoring power in the present disclosure, the private generator may include a solar cell. In the step of calculating the amount of power available, state information indicating current power generation of the solar cell and weather information may be obtained, and the estimated private power generation may be calculated using the state information and the weather information.

In this case, since the estimated private power generation of the solar cell is calculated using the state information indicating the current power generation of the solar cell and the weather information, the estimated private power generation can be accurately calculated.

In addition, in the method for monitoring power in the present disclosure, in the private generator may include a fuel cell. In the step of calculating the amount of power available, the estimated private power generation may be calculated using state information indicating current power generation of the fuel cell.

In this case, since the estimated private power generation of the fuel cell is calculated using the state information indicating the current power generation of the fuel cell and the weather information, the estimated private power generation can be accurately calculated.

In addition, in the method for monitoring power in the present disclosure, in the step of calculating the estimated power consumption, an amount of power of a preset operation, which is a sum of power consumption of the preset electric devices in each period, may be calculated using the preset information and the power consumption information, and the estimated power consumption may be calculated by adding an amount of base power in each period, which is calculated from an amount of power consumed in the building when a user is absent from the building and an amount of power consumed in the building in middle of night, to the calculated amount of power of the preset operation.

In this case, since the estimated power consumption is calculated on the basis of not only the power consumption of the preset electric devices but also the amount of base power, which indicates the amount of power constantly consumed in the building, the estimated power consumption can be accurately calculated.

In addition, in the method for monitoring power in the present disclosure, priority in changing instructions may be determined in advance for the electric devices to be preset, In the step of generating the alternative instruction, the alternative instruction may be generated by identifying an exceeding period, in which the estimated power consumption exceeds the amount of power available, and extracting, for the exceeding period, electric devices for which instructions are to be changed in order of priority until the estimated power consumption becomes lower than or equal to the amount of power available.

In this case, since the preset electric devices are extracted in order of priority, it is possible to avoid canceling instructions given to the electric devices that the user truly desires to operate.

In addition, in the method for monitoring power in the present disclosure, in the step of generating the alternative instruction, a first alternative instruction to cancel a preset operation and a second alternative instruction to move a period of the preset operation to a period other than the exceeding period may be generated for the extracted electric devices.

In this case, since the first alternative instruction to cancel the preset operation and the second alternative instruction to move the period of the preset operation are suggested to the user, more alternative instructions can be suggested to the user. As a result, the user can select an alternative instruction that better suits his/her desire.

In addition, in the method for monitoring power in the present disclosure, in the step of generating the alternative instruction, an alternative instruction to move the period of the preset operation may be generated as the second alternative instruction for, among the extracted electric devices, an electric device for which movement of the period of the preset operation is permitted in advance, and an alternative instruction to cancel the preset operation may be generated as the second alternative instruction for an electric device for which movement of the preset operation is not permitted.

In this case, it is possible to avoid generating a second alternative instruction to move the period of the preset operation for an electric device for which the user does not desire to move the period of the preset operation.

In addition, in the method for monitoring power in the present disclosure, in the step of generating the alternative instruction, a first sum, which is a sum of power consumption of first electric devices having a first priority level, which is a highest priority level, in the exceeding period may be calculated using the power consumption information, and, if the first sum exceeds an amount of power to be suppressed, which is obtained by subtracting the amount of power available from the estimated power consumption, room, which is obtained by subtracting the amount of power to be suppressed from the first sum, may be calculated and an extraction process may be performed in which one or more first electric devices with which a sum of power consumption is smaller than or equal to the room are extracted using the power consumption information and first electric devices other than the extracted first electric devices are extracted as electric devices for which instructions are to be changed.

In this case, the first sum, which is the sum of the power consumption of the first electric devices having the first priority level, which is the highest priority level, in the exceeding period is calculated. The amount of power to be suppressed in the exceeding period is then calculated by subtracting the amount of power available from the estimated power consumption, and, if the first sum exceeds the amount of power to be suppressed, the room is calculated by subtracting the amount of power to be suppressed from the first sum. The first electric devices with which the sum of power consumption is smaller than or equal to the room in the exceeding period are then extracted, and the first electric devices other than the extracted first electric devices are extracted as the electric devices for which instructions are to be changed. Here, the room indicates the amount of power that can be consumed in the exceeding period. Therefore, by extracting the preset first electric devices such that the sum of power consumption becomes smaller than or equal to the room and extracting the first electric devices other than the extracted first electric devices as the electric devices for which instructions are to be changed, the amount of power to be suppressed in the exceeding period can be 0.

In addition, in the method for monitoring power in the present disclosure, in the step of generating the alternative instruction, if the first sum is smaller than or equal to the amount of power to be suppressed, all the first electric devices may be extracted as electric devices for which instructions are to be changed, the amount of power to be suppressed may be updated by subtracting the first sum from the amount of power to be suppressed, and the extraction process may be applied to electric devices having a second priority level, which is a second highest priority level.

In this case, if the amount of power to be suppressed cannot be 0 using only the first sum, the extraction process is applied to the electric devices having the second priority level after the amount of power to be suppressed is updated by subtracting the first sum from the amount of power to be suppressed. Therefore, the amount of power to be suppressed in the exceeding time can be suppressed as much as possible.

A recording medium in an aspect of the present disclosure is a non-transitory tangible recording medium storing a computer-readable computer program for monitoring power demand of electric devices installed in a building. The non-transitory recording medium causing a computer to perform a process includes receiving preset information that defines periods in which one or more preset electric devices are scheduled to operate, calculating an amount of power available, which is an estimated amount of power available in the building in each period, calculating estimated power consumption, which is estimated power consumption in the building in each period, using power consumption information, to which power consumption of the electric devices to be preset is registered in advance, and the preset information, generating an alternative instruction with which the estimated power consumption becomes lower than or equal to the amount of power available, and displaying the alternative instruction on a terminal apparatus.

In this case, a user inputs the preset information for presetting the electric devices installed in the building. The amount of power available, which is the estimated amount of power available in the building in each period, is then calculated using power supply information. For example, if each period lasts 30 minutes, the estimated amount of power available until a certain period of time later is calculated at intervals of 30 minutes.

The estimated power consumption, which is the estimated power consumption of the preset electric devices in each period, is then calculated using the power consumption information and the preset information.

The alternative instruction with which the estimated power consumption becomes lower than the amount of power available is then generated, and the generated alternative instruction is displayed on the terminal apparatus.

Therefore, whether or not power saving will be necessary in each period in which the electric devices are scheduled to operate can be determined in advance, and, if power saving will be necessary, information regarding the power saving can be displayed on the terminal apparatus. As a result, by changing in advance instructions given to the electric devices, the user can avoid a situation in which the preset electric devices do not operate due to insufficient power.

A power monitoring apparatus according to an aspect of the present disclosure is a power monitoring apparatus used in a power monitoring system that monitors power demand of electric devices installed in a building. The power monitoring apparatus includes a presetter that receives preset information that defines periods in which one or more preset electric devices are scheduled to operate, a power amount estimator that calculates an amount of power available, which is an estimated amount of power available in the building in each period, a power consumption estimator that calculates estimated power consumption, which is estimated power consumption in the building in each period, using power consumption information, to which power consumption of the electric devices to be preset is registered in advance, and the preset information, an alternative instruction generator that generates an alternative instruction with which the estimated power consumption becomes lower than or equal to the amount of power available, and an alternative instruction suggester that displays the alternative instruction on a terminal apparatus. And at least one of the presetter, power amount estimator, power consumption estimator, alternative instruction generator, and alternative instruction suggester may include a processor.

In this case, a user inputs the preset information for presetting the electric devices installed in the building. The amount of power available, which is the estimated amount of power available in the building in each period, is then calculated using power supply information. For example, if each period lasts 30 minutes, the estimated amount of power available until a certain period of time later is calculated at intervals of 30 minutes.

The estimated power consumption, which is the estimated power consumption of the preset electric devices in each period, is then calculated using the power consumption information and the preset information.

The alternative instruction with which the estimated power consumption becomes lower than the amount of power available is then generated, and the generated alternative instruction is displayed on the terminal apparatus.

Therefore, whether or not power saving will be necessary in each period in which the electric devices are scheduled to operate can be determined in advance, and, if power saving will be necessary, information regarding the power saving can be displayed on the terminal apparatus. As a result, by changing in advance instructions given to the electric devices, the user can avoid a situation in which the preset electric devices do not operate due to insufficient power.

First Embodiment

FIG. 1 is a diagram illustrating an example of the overall configuration of a power monitoring system according to a first embodiment. The power monitoring system includes a power monitoring apparatus 100, a mobile terminal 400 (an example of the terminal apparatus), and a home network provided for a house 500. The power monitoring apparatus 100 is a cloud server that monitors the power demand of electric devices 504 installed in the house 500 (an example of the building) of a user and includes one or a plurality of computers.

An electric power company server 200, a weather information providing server 300, the mobile terminal 400, and a home gateway 501 are connected to the power monitoring apparatus 100 through a network NT1. As the network NT1, for example, a public communication network including an Internet communication network and a mobile phone communication network is adopted. The power monitoring apparatus 100, the electric power company server 200, the weather information providing server 300, the mobile terminal 400, and the home gateway 501 communicate with one another using a communication protocol such as the transmission control protocol and the Internet protocol (TCP/IP).

The electric power company server 200 is, for example, a web server managed by an electric power company that supplies AC power and provides, for the power monitoring apparatus 100, power supply information indicating an estimation of temporal changes in the amount of power that can be supplied by the electric power company.

The weather information providing server 300 is, for example, a web server managed by a weather information providing company that provides weather information indicating estimated temporal changes in weather and provides the weather information for the power monitoring apparatus 100.

The mobile terminal 400 is, for example, a mobile information processing apparatus such as a smartphone, a tablet terminal, or a push-button mobile phone and owned by the user who lives in the house 500. As the terminal apparatus, for example, a desktop personal computer may be adopted instead of the mobile terminal 400.

The house 500 is where the user for which a service is provided from the power monitoring apparatus 100 lives. In the house 500, the home network including the home gateway 501, a solar cell 502, a fuel cell 503, and the electric devices 504 is constructed.

The home gateway 501 is a communication apparatus for connecting the solar cell 502, the fuel cell 503, and the electric devices 504 installed in the house 500 to the network NT1. The solar cell 502, the fuel cell 503, and the electric devices 504 can transmit various pieces of information to the power monitoring apparatus 100 through the home gateway 501.

More specifically, the solar cell 502 and the fuel cell 503 are connected to the home gateway 501 through a network NT2, and the electric devices 504 are connected to the home gateway 501 through a network NT3. As the network NT2, for example, an equipment network constructed around a smart distribution board is adopted, and, for example, communication using a communication protocol such as ECHONET is performed. As the network NT3, a network constructed around the home gateway 501, such as a wireless local area network (LAN) or a wired LAN, is adopted, and, for example, communication using a communication protocol such as ECHONET, High-Definition Multimedia Interface (HDMI; registered trademark), or a digital living network alliance (DLNA; registered trademark) is performed. The home gateway 501 and the smart distribution board are compatible with a non-open communication protocol for connecting the home gateway 501 and the smart distribution board to each other and communicate with each other using this communication protocol.

The solar cell 502 is a private generator that generates power by receiving sunlight and that includes a solar panel mounted, for example, on a roof of the house 500 and a storage apparatus that stores electricity generated by the solar panel. The fuel cell 503 is, for example, a private generator that generates power using oxygen and hydrogen. As the fuel cell 503, for example, a proton exchange membrane fuel cell, a phosphoric acid fuel cell, a molten carbonate fuel cell, a solid oxide fuel cell, or the like is adopted.

The solar cell 502 and the fuel cell 503 transmit their respective pieces of state information, which will be described later, to the power monitoring apparatus 100 through the smart distribution board and the home gateway 501.

The electric devices 504 are electric devices to be preset. For example, the electric devices 504 can begin to operate or stop operating in accordance with instructions input by the user by operating the mobile terminal 400 and can operate in ways according to the instructions (for example, an air conditioner can operate in a heating mode at a temperature of 22° C.)

As the electric devices 504, for example, home appliances such as an air conditioner, a washing machine, and a refrigerator and AV devices such as a television set and a recorder are adopted. In the example illustrated in FIG. 1, an air conditioner, a washing machine, a smart television, a recorder, a rice cooker, and an electric kettle are adopted. These electric devices, however, are examples, and various electric devices such as a dishwasher and a water heater may be adopted, instead.

Although the house 500 is illustrated in FIG. 1 as an example of the building, the type of building is not limited to this, and a multistoried building or a room of a multistoried building may be adopted as an example of the building, instead. Alternatively, as the house 500, for example, a house or a room of an apartment house may be adopted.

Figure 2:
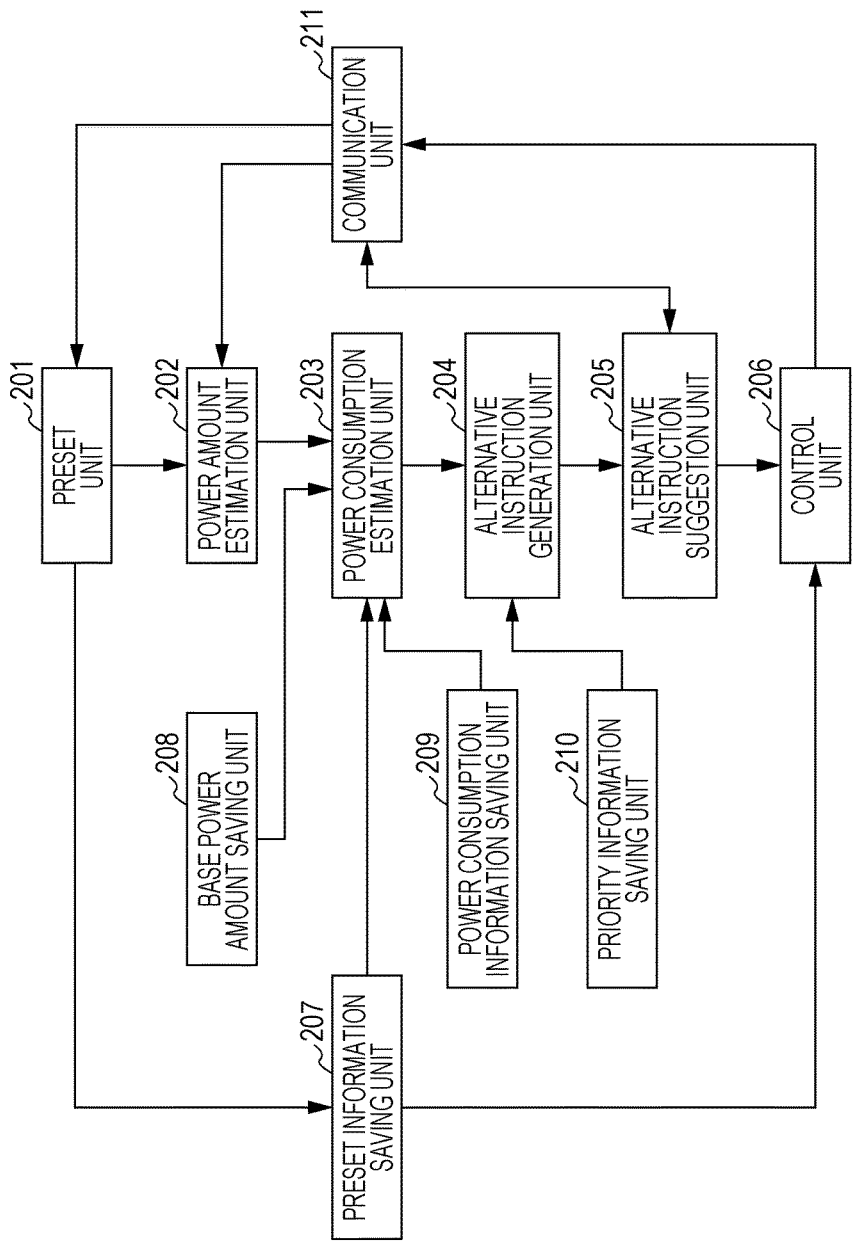
FIG. 2 is a block diagram illustrating an example of the configuration of a power monitoring apparatus according to the first embodiment.

FIG. 2 is a block diagram illustrating an example of the configuration of the power monitoring apparatus 100 according to this embodiment. The power monitoring apparatus 100 includes a preset unit 201, a power amount estimation unit 202, a power consumption estimation unit 203, an alternative instruction generation unit 204, an alternative instruction suggestion unit 205, a control unit 206, a preset information saving unit 207, a base power amount saving unit 208, a power consumption information saving unit 209, a priority information saving unit 210, and a communication unit 211.

The preset unit 201 receives preset information, which defines periods in which the electric devices 504 are scheduled to operate, input by the user. More specifically, the preset unit 201 obtains preset information indicating instructions to the electric devices 504 input by the user using the mobile terminal 400, the preset information being transmitted from the mobile terminal 400 through the communication unit 211. The preset unit 201 saves the obtained preset information to the preset information saving unit 207.

FIG. 9 is a diagram illustrating an example of the data structure of the preset information. The preset information includes target device identifiers (IDs), operation times, and instructions. The target device IDs are identification information for identifying the electric devices 504 preset by the user. Although the target device IDs are the names of the electric devices 504 in the example illustrated in FIG. 9, this is just an example. Any type of information may be adopted insofar as the electric devices 504 can be identified using the information. For example, the serial numbers of the electric devices 504 may be adopted.

The operation times are information regarding the operation times of the preset electric devices 504. The operation times of each electric device 504 include at least two of the following pieces of information: an operation date, an operation start time, and an operation end time. For example, in the case of an electric device 504 for which only the operation start time can be set, the operation date and the operation start time are registered as the operation times. In the case of an electric device 504 for which only the operation end time can be set, the operation date and the operation end time are registered as the operation times. In the case of an electric device 504 for which the operation start time and the operation end time can be set, the operation date and either the operation start time or the operation end time are registered as the operation times. In the case of an electric device 504 for which both the operation start time and the operation end time need to be set, the operation date, the operation start time, and the operation end time are registered as the operation times.

The instructions are instructions given to the preset electric devices 504. The instructions include information indicating how the preset electric devices 504 will be controlled. For example, in the case of an air conditioner, an operation mode such as a cooling mode or a heating mode, temperature, air volume, wind direction, and the like are adopted as the instructions.

If a plurality of users have been registered to the power monitoring apparatus 100, the preset information illustrated in FIG. 9 is determined by each user. Therefore, each piece of the preset information is associated with a user ID, which is not illustrated.

In FIG. 2, the power amount estimation unit 202 obtains power supply information provided by the electric power company from the electric power company server 200 through the communication unit 211 and calculates the estimated amount of external power, which is the estimated amount of power in each period supplied from the electric power company, using the obtained power supply information.

The power amount estimation unit 202 obtains the current power generation of the solar cell 502 from the solar cell 502 as state information regarding the solar cell 502 and weather information from the weather information providing server 300. The power amount estimation unit 202 then calculates, using the obtained state information and weather information, first estimated power generation, which indicates the estimated amount of power generated by the solar cell 502 in each period.

The power amount estimation unit 202 also obtains the current power generation of the fuel cell 503 from the fuel cell 503 as state information regarding the fuel cell 503 and calculates second estimated power generation, which indicates the estimated amount of power generated by the fuel cell 503 in each period, using the obtained state information.

The power amount estimation unit 202 adds the estimated amount of external power, the first estimated power generation, and the second estimated power generation together in each period to calculate the amount of power available, which is the estimated amount of power available in the house 500 in each period.

Here, as the length of each period, for example, 30 minutes, one hour, two hours, three hours, or the like may be adopted. For example, if 30 minutes is adopted as the length of each period, the power amount estimation unit 202 calculates the amount of power available until a certain period of time later at intervals of 30 minutes. More specifically, if it is 0:00 and the certain period of time is 24 hours, the power amount estimation unit 202 calculates the amount of power available until 24 hours later at intervals of 30 minutes by calculating the amount of power available from 0:00 to 0:30, that from 0:30 to 1:00, that from 1:00 to 1:30, and so on.

Although an example in which the private generators including the solar cell 502 and the fuel cell 503 are installed in the house 500 has been described above, no private generator might be installed depending on the house 500. In this case, the power amount estimation unit 202 may calculate the amount of power available only on the basis of the estimated amount of external power. In addition, depending on the house 500, only either the solar cell 502 or the fuel cell 503 might be installed. In this case, the power amount estimation unit 202 may calculate the amount of power available by adding the estimated amount of external power to the first estimated power generation or the second estimated power generation.

The power consumption estimation unit 203 calculates estimated power consumption, which is estimated power consumption in the house 500 in each period, using power consumption information saved in the power consumption information saving unit 209 and preset information saved in the preset information saving unit 207. The power consumption information is information to which the power consumption of the electric devices 504 to be preset is registered in advance.

FIG. 10 is a diagram illustrating an example of the data structure of the power consumption information. The power consumption information includes device types and power consumption. The device types are identification information regarding the electric devices 504. In the example illustrated in FIG. 10, as with the target device IDs illustrated in FIG. 9, the names of the electric devices 504 are registered as the device types. As a result, the electric devices 504 registered to the device types illustrated in FIG. 10 and the electric devices 504 registered to the target device IDs illustrated in FIG. 9 are associated with each other. This, however, is an example, and another type of information may be registered as the device types, instead. For example, if the serial numbers of the electric devices 504 are registered as the target device IDs illustrated in FIG. 9, the serial numbers of the electric devices 504 may be registered as the device types.

In the example illustrated in FIG. 10, a first air conditioner, a second air conditioner, a first washing machine, a first electric kettle, a bath water heater, a rice cooker, and a microwave are registered as the device types. This is because these electric devices are the electric devices 504 that can be preset. This, however, is an example, and another electric device 504 such as a television set or a floor heating device may be registered in FIG. 10, instead.

The power consumption is the power consumption of the electric devices 504. For example, in the case of an electric device 504 whose device type is the first air conditioner, 90 W is registered as the power consumption at a time when the temperature of the first air conditioner is set at 28° C., 50 W is registered as power consumed by the first air conditioner when the temperature of the first air conditioner is changed, and 20 W is registered as power consumed by the first air conditioner when the air volume of the first air conditioner is changed.

Although only the power consumption when the temperature is set at 28° C. is registered as the power consumption of the first air conditioner illustrated in FIG. 10, power consumption at each temperature may be registered, instead. In addition, although the three types of power consumption are registered as the power consumption of the first air conditioner, another type of power consumption, that is, for example, power consumed by the first air conditioner when the operation mode is switched, may be registered, instead. The power consumption information may be provided for each user, or only a single piece of power consumption information may be provided. If only a single piece of power consumption is provided, for example, the model number of the electric device 504 may be registered as the device type. In this case, the serial number of the electric device 504 may be registered as the target device ID of the preset information illustrated in FIG. 9. Because the serial number includes information identifying the model number, the model number can be identified from the serial number, and the target device ID illustrated in FIG. 9 and the device type illustrated in FIG. 10 can be associated with each other.

Here, the power consumption estimation unit 203 calculates the amount of power of a preset operation, which is the sum of the power consumption of all the preset electric devices 504 in each period, using the preset information and the power consumption power information. The power consumption estimation unit 203 then calculates the estimated power consumption by adding the amount of base power saved in the base power amount saving unit 208 to the amount of power of the preset operation. The amount of base power indicates temporal changes in the amount of power in each period calculated from the amount of power consumed in the house 500 when the user is absent from the house 500 and the amount of power consumed in the house 500 in the middle of the night. For example, a refrigerator and a night light constantly consume power regardless of whether the preset electric devices 504 are turned on or off. The amount of base power takes into consideration the power consumption of such electric devices. The base power amount saving unit 208 saves the amount of base power for each user while associating the amount of base power with the user ID.

The alternative instruction generation unit 204 identifies an exceeding period, in which the estimated power consumption exceeds the amount of power available, and generates alternative instructions, which change the instructions indicated by the preset information, such that the estimated power consumption becomes lower than the amount of power available in the exceeding period. Here, the alternative instruction generation unit 204 reads, from the priority information saving unit 210, priority information indicating priority in changing the instructions for each of the electric devices 504 to be preset. The alternative instruction generation unit 204 then generates the alternative instructions by extracting, until the estimated power consumption becomes lower than the amount of power available, the electric devices 504 for which the preset operation is canceled in the exceeding period.

FIG. 11 is a diagram illustrating an example of the data structure of the priority information. The priority information includes device types, priority levels, and next best operations. The device types are the same as the device types illustrated in FIG. 10. Priority levels in changing instructions given to the electric devices 504 registered in the same record are registered as the priority levels. In the example illustrated in FIG. 11, two priority levels, namely A and B, are registered, and the priority level A is higher than the priority level B. Therefore, first, whether to change the instructions given to the electric devices 504 whose priority levels are A is examined, and if the estimated power consumption does not become lower than the amount of power available even after the instructions are changed, whether to change the instructions given to the electric devices 504 whose priority levels are B is examined.

Although the two priority levels, namely A and B, are illustrated in FIG. 11, this is an example. Three or more priority levels, namely C, D, E, and so on, may be used, instead. In addition, if the priority levels indicated by A and B are assumed to be first priority levels, second priority levels indicating differences in priority between the electric devices 504 whose first priority levels are the same may be used. For example, in FIG. 11, the second air conditioner, the first washing machine, the first electric kettle, the bath water heater, and the microwave are registered as the electric devices 504 having the priority level A, and second priority levels A1>A2>A3>A4>A5 may be provided for these electric devices in this order. Similarly, second priority levels may be provided for the electric devices 504 whose first priority levels are B in the same manner as for the electric devices 504 whose first priority levels are A. In this case, first, the alternative instruction generation unit 204 may extract, in order of A1, A2, and so on, the electric devices 504 for which the instructions are to be changed and then extract, in order of B1, B2, and so on, the electric devices 504 for which the instructions are to be changed.

As each of the next best operations, information indicating whether there is a next best operation other than an operation for canceling an instruction given to a preset electric device 504 when the instruction given to the electric device 504 is changed and information regarding the next best operation are registered. Here, "accelerated operation before the peak" and "cancel" are registered as the next best operations.

An electric device 504 for which "cancel" is registered as the next best operation is an electric device 504 for which an instruction can be changed only by canceling the instruction. That is, there is no next best operation for such an electric device 504.

An electric device 504 for which "accelerated operation before the peak" is registered as the next best operation is an electric device 504 for which there is a next best operation. The operation time of such an electric device 504 can be accelerated as the next best operation, in order to avoid an exceeding period.

In FIG. 11, "delayed operation after the peak" may be registered as the next best operation instead of "accelerated operation before the peak". In this case, the operation time of an electric device 504 for which "delayed operation after the peak" has been registered is delayed in order to avoid an exceeding period.

The priority information is, for example, generated in advance by the power monitoring apparatus 100 in accordance with information input by the user to the mobile terminal 400 and saved to the preset information saving unit 207. Therefore, the priority levels and the next best operations are arbitrarily specified by the user. The priority information is, for example, provided for each user and associated with each user ID.

In FIG. 2, the alternative instruction suggestion unit 205 transmits the alternative instructions generated by the alternative instruction generation unit 204 to the mobile terminal 400 through the communication unit 211 to suggest the alternative instructions to the user. Upon receiving the alternative instructions, the mobile terminal 400 displays the alternative instructions on a display unit thereof. The mobile terminal 400 then receives a response from the user as to whether to accept the alternative instructions and transmits a response notification indicating the response to the power monitoring apparatus 100. Upon receiving the response notification through the communication unit 211, the alternative instruction suggestion unit 205 determines whether the obtained response notification indicates acceptance of the alternative instructions.

If the response notification indicates acceptance, the control unit 206 updates the preset information saved in the preset information saving unit 207 using the alternative instructions. On the other hand, if the response notification does not indicate acceptance, the control unit 206 does not update the preset information. The control unit 206 then causes the preset electric devices 504 to operate in accordance with a preset schedule indicated by the preset information saved in the preset information saving unit 207. For example, if an air conditioner is scheduled to begin to operate at 15:00 in the preset schedule, the control unit 206 transmits, at 15:00, a control command to begin to operate the air conditioner to the home gateway 501 of the house 500 of a corresponding user through the communication unit 211. Upon receiving the control command, the home gateway 501 transmits the control command to the air conditioner to operate the air conditioner.

In FIG. 2, the preset unit 201, the power amount estimation unit 202, the power consumption estimation unit 203, the alternative instruction generation unit 204, the alternative instruction suggestion unit 205, and the control unit 206 are realized, for example, by a processor (or circuitry) of a computer by executing a computer-readable power monitoring program for causing the computer to function as the power monitoring apparatus 100. The preset information saving unit 207, the base power amount saving unit 208, the power consumption information saving unit 209, and the priority information saving unit 210 are, for example, configured by a nonvolatile storage device. For example, the nonvolatile storage device may be a memory, a hard disk, or the like. For example, the memory may be a read-only memory (ROM), a random access memory (RAM), or the like.

The communication unit 211 is, for example, configured by a communication device for connecting the computer to the Internet, such as a modem. For example, the communication device may include a communication circuit (or circuitry) for connecting the computer to the Internet.

Figure 3:
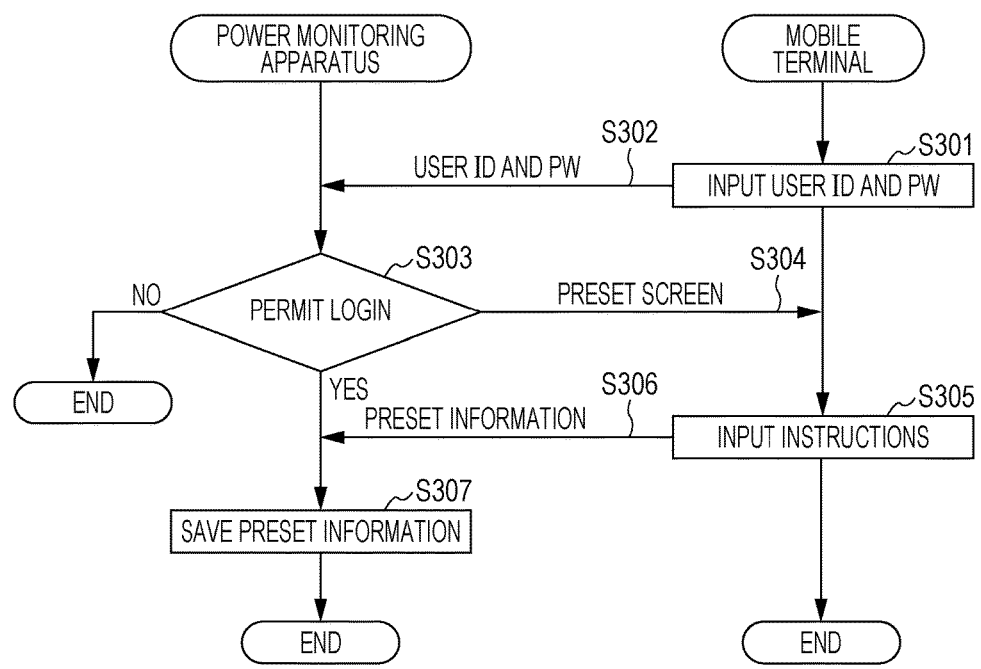
FIG. 3 is a sequence diagram illustrating an example of a process performed between the power monitoring apparatus and a mobile terminal when a user presets electric devices.

FIG. 3 is a sequence diagram illustrating an example of a process performed between the power monitoring apparatus 100 and the mobile terminal 400 when the user presets the electric devices 504. First, the user operates the mobile terminal 400 to input a user ID and a password (hereinafter also referred to as a "PW") (S301). As the user ID and the password, for example, a user ID and a password input by the user during registration of the user to the power monitoring apparatus 100 may be adopted.

The mobile terminal 400 then transmits, to the power monitoring apparatus 100, the user ID and the PW input through the network NT1 (S302).

If the input user ID and PW match a user ID and a PW registered in advance (YES in S303), the preset unit 201 of the power monitoring apparatus 100 permits the user to log in. On the other hand, if the input user ID and PW do not match a user ID and a PW registered in advance (NO in S303), the preset unit 201 does not permit the user to log in and notifies the mobile terminal 400 that the user ID and/or the PW is incorrect.

After permitting the user to log in, the preset unit 201 transmits drawing data regarding a preset screen to the mobile terminal 400 (S304). Here, for example, data written in a language such as HyperText Markup Language (HTML), Extensible Markup Language (XML), or JavaScript (registered trademark) is adopted as the drawing data.

Upon receiving the drawing data regarding the preset screen, the mobile terminal 400 displays the preset screen on the display unit thereof to ask the user to preset the electric devices 504. If the user inputs instructions in accordance with the preset screen (S305), the mobile terminal 400 transmits preset information indicating the input instructions to the power monitoring apparatus 100 (S306).

The preset unit 201 of the power monitoring apparatus 100 obtains the preset information transmitted from the mobile terminal 400 through the communication unit 211 and saves the preset information to the preset information saving unit 207. As a result, for example, the preset information illustrated in FIG. 9 is saved to the preset information saving unit 207.

Figure 4:
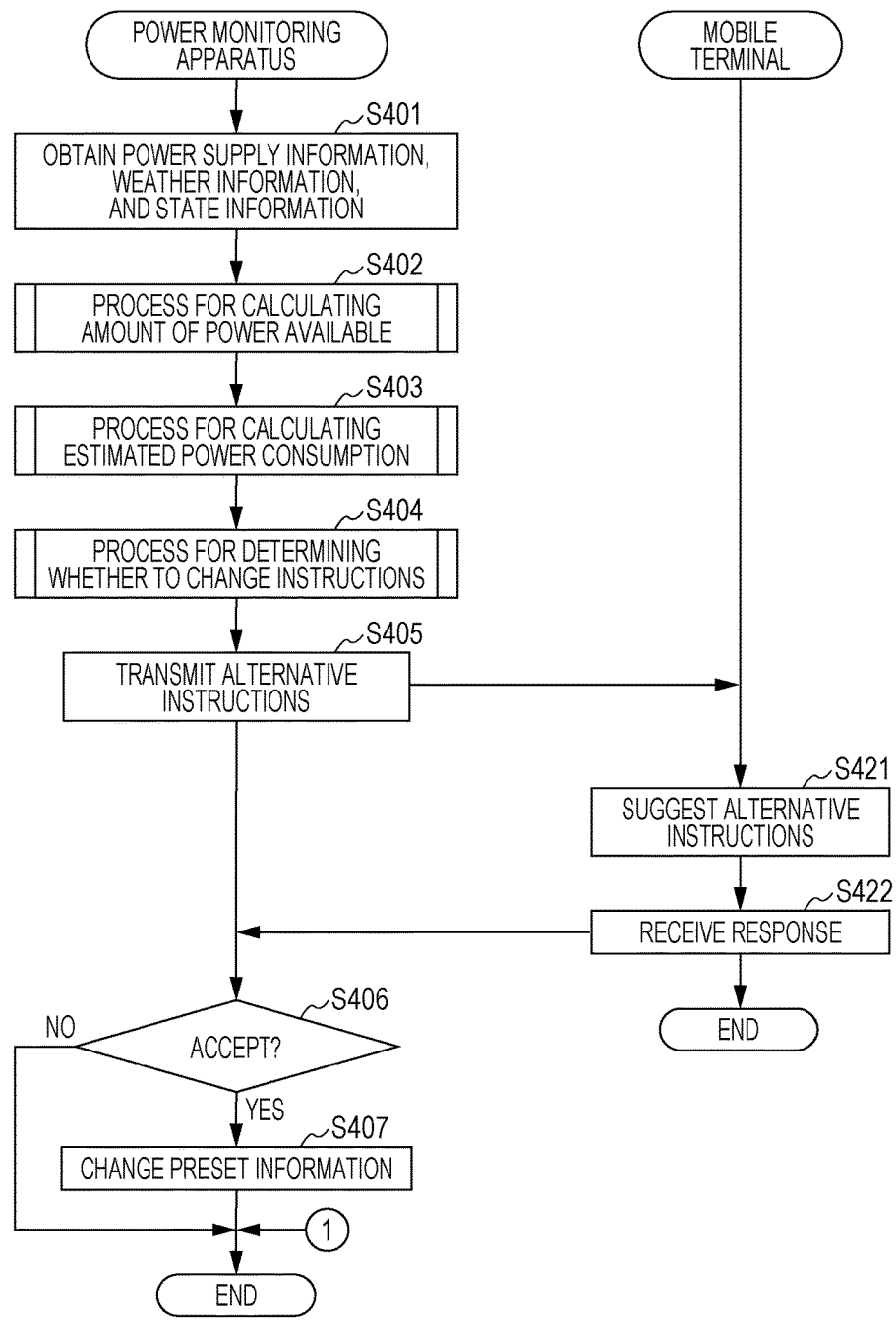
FIG. 4 is a sequence diagram illustrating an example of a process performed between the power monitoring apparatus and the mobile terminal when alternative instructions are generated.

FIG. 4 is a sequence diagram illustrating an example of a process performed between the power monitoring apparatus 100 and the mobile terminal 400 when alternative instructions are generated. The process illustrated in FIG. 4 is, for example, performed regularly and after a user presets the electric devices 504 by performing the process illustrated in FIG. 3. Intervals at which the process illustrated in FIG. 4 is regularly performed may be, for example, the same length of time as each period, or may be a certain period of time such as 30 minutes, one hour, or two hours, regardless of the length of each period. If the process illustrated in FIG. 4 is regularly performed, the process illustrated in FIG. 4 is performed for all users registered in the power monitoring apparatus 100. If the process illustrated in FIG. 4 is performed after a user presets the electric devices 504 by performing the process illustrated in FIG. 3, the process illustrated in FIG. 4 is performed only for the user who has preset the electric devices 504.

First, the power amount estimation unit 202 of the power monitoring apparatus 100 accesses the electric power company server 200 and the weather information providing server 300 to obtain the power supply information and electricity information and obtains the state information from the solar cell 502 and the fuel cell 503 (S401).

Next, the power amount estimation unit 202 performs a process for calculating the amount of power available (S402). Next, the power consumption estimation unit 203 performs a process for calculating the estimated power consumption (S403). Next, the alternative instruction generation unit 204 performs a process for determining whether to change the instructions (S404). Next, the alternative instruction suggestion unit 205 transmits information indicating alternative instructions to the mobile terminal 400 through the communication unit 211 and the network NT1 (S405). The mobile terminal 400 suggests the received alternative instructions to the user (S421). Here, the information indicating the alternative instructions is, for example, data written in a language such as HTML or XML. Upon receiving the information indicating the alternative instructions with a communication unit, the mobile terminal 400 displays a response screen including the alternative instructions on the display unit.

Figure 17:
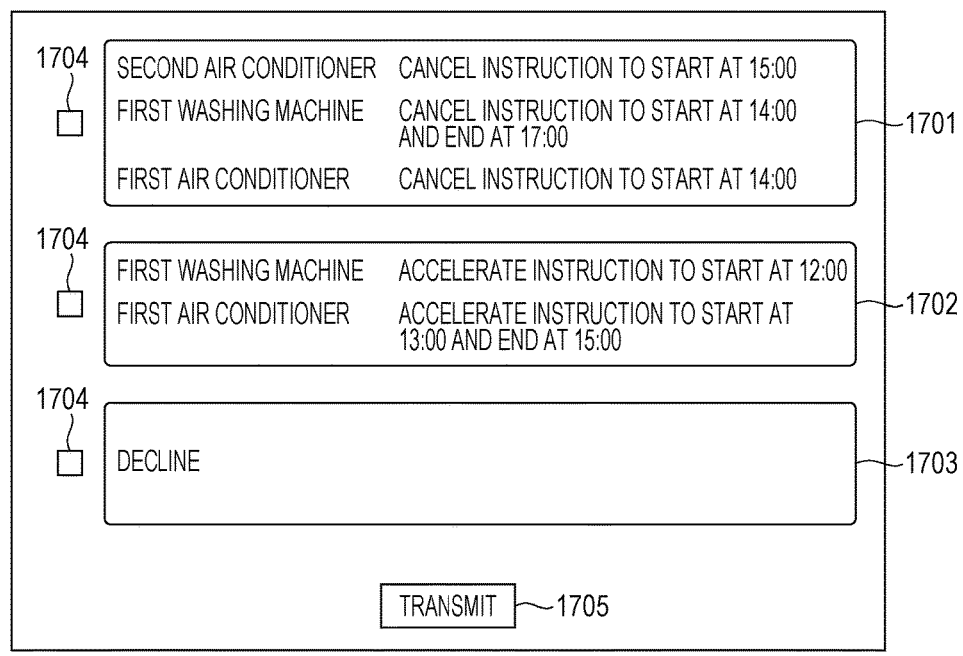
FIG. 17 is a diagram illustrating an example of a response screen.

In this case, for example, a response screen illustrated in FIG. 17 is displayed. FIG. 17 is a diagram illustrating an example of the response screen. In the response screen, a first display field 1701 including first alternative instructions, a second display field 1702 including second alternative instructions, and a third display field 1703 including a text, "decline", are displayed.

The first alternative instructions cancel all the instructions given to the electric devices 504 extracted as electric devices 504 for which instructions are to be changed. In the example illustrated in FIG. 17, the second air conditioner, the first washing machine, and the first air conditioner are extracted in the first display field 1701 as electric devices 504 for which instructions are to be changed. The first display field 1701 includes alternative instructions to cancel all the instructions given to these electric devices 504.

The second alternative instructions move the periods in which, among the electric devices 504 extracted as the electric devices 504 for which instructions are to be changed, electric devices 504 are scheduled to operate for the electric devices 504 whose periods are allowed by the priority information to be changed and cancel instructions given to electric devices 504 whose periods are not allowed to be changed. That is, the second alternative instructions change, in accordance with the registered next best operations, instructions given to the electric devices 504 to which the next best operations are registered in the priority information.

In the example illustrated in FIG. 17, the first washing machine and the first air conditioner are extracted in the second display field 1702 as the electric devices 504 for which instructions are to be changed. Accelerated operation times of these electric devices 504 are indicated in the second display field 1702, instead of the operation times determined by the user.

For example, three check boxes 1704 corresponding to the first to third display fields 1701 to 1703 are displayed to the left of the first to third display fields 1701 to 1703. For example, if the user selects the first alternative instructions, the user checks the check box 1704 in a first row, which corresponds to the first display field 1701. If the user selects the second alternative instructions, the user checks the check box 1704 in a second row, which corresponds to the second display field 1702. If the user does not accept either the first or second alternative instructions, the user checks the check box 1704 in a third row, which corresponds to the third display field 1703.

If the user selects a transmission button 1705 after checking one of the check boxes 1704, the mobile terminal 400 receives the instructions (instructions displayed in the display field corresponding to the check box 1704 checked by the user) selected by the user as a response from the user (S422) and transmits a response notification indicating the response to the power monitoring apparatus 100. The response notification is received by the communication unit 211 and transmitted to the alternative instruction suggestion unit 205. Upon receiving the information indicating the response, the alternative instruction suggestion unit 205 determines, if the response from the user indicates that the first or second alternative instructions have been selected, that the user has accepted the alternative instructions (YES in S406). The control unit 206 updates the preset information, which is saved in the preset information saving unit 207, set by the corresponding user in accordance with a result of the determination made by the alternative instruction suggestion unit 205 (S407). In this case, if the user has selected the first alternative instructions, the alternative instruction suggestion unit 205 updates the preset information using the first alternative instructions and, if the user has selected the second alternative instructions, the alternative instruction suggestion unit 205 updates the preset information using the second alternative instructions. The process then ends.

On the other hand, if the response from the user indicates that the user has not accepted either the first or second alternative instructions, the alternative instruction suggestion unit 205 determines that the user has not accepted the alternative instructions (NO in S406) and ends the process without updating the preset information.

The control unit 206 reads the preset information that has been or has not been updated from the preset information saving unit 207 and transmits a control command to the electric devices 504 in accordance with the preset schedule defined in the preset information to control the electric devices 504. In the example illustrated in FIG. 9, an operation time "9/5/2103 Starts at 14:00" and an instruction "cooling, temperature: 28° C., air volume: automatic, wind direction: automatic" are registered to the first air conditioner. Therefore, at 14:00 on Sep. 5, 2013, the control unit 206 generates a control command to cause the first air conditioner to begin to operate in accordance with the registered instruction and transmits the control command to the first air conditioner through the communication unit 211. The control command includes a communication address of the home gateway 501 of the house 500 of a corresponding user and a target device ID of the first air conditioner. Therefore, the control command is transmitted to the first air conditioner through the home gateway 501 of the house 500 of the corresponding user. Upon receiving the control command, the first air conditioner begins to operate.

Figure 5:
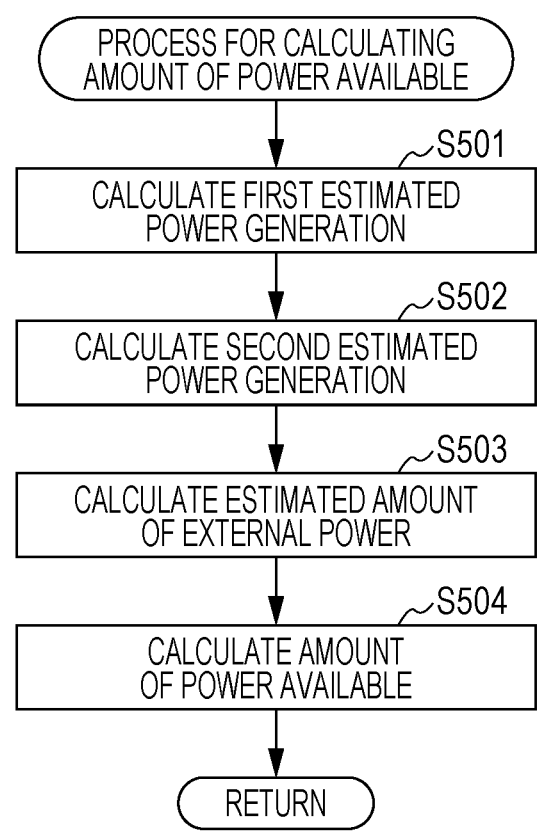
FIG. 5 is a flowchart illustrating an example of a process for calculating the amount of power available illustrated in FIG. 4.

FIG. 5 is a flowchart illustrating an example of the process for calculating the amount of power available illustrated in FIG. 4. First, the power amount estimation unit 202 calculates the first estimated power generation, which indicates the estimated power generation of the solar cell 502 in each period, using the state information regarding the solar cell 502 obtained in S401 and the weather information obtained from the weather information providing server 300 in S401 (S501).

For example, the power amount estimation unit 202 extracts weather conditions in each period from the weather information and estimates how the current weather conditions, which serve as a reference, change in each period. The power amount estimation unit 202 may then calculate a power generation coefficient K in accordance with the obtained change and calculate the first estimated power generation by multiplying the current power generation of the solar cell 502 indicated by the state information by the calculated power generation coefficient K.

Here, the weather conditions are, for example, information determined by weather and temperature parameters indicated by the weather information. In this case, the power generation coefficient K can be expressed as $K=K0 \cdot \alpha \cdot \beta$, where $K0$ denotes a default value, $\alpha$ denotes a variation coefficient of weather, and β denotes a variation coefficient of temperature. Here, K0 is, for example, 1.

The types of weather include, for example, "sunny", "cloudy", and "rainy", and u, which denotes the state value of weather, is defined as "3", "2", and "1", respectively. If the state value of the current weather is denoted by u(T0) and the state value of weather in a certain period T1 is denoted by u(T1), a difference Δu between the state values of weather is expressed as Δu=u(T1)-u(T0). In this case, for example, the variation coefficient α of weather in the period T1 is calculated in the following manner.

If Δu=0, α=1. If Δu=+1, α=1+α1 (where 0<α2<1). If Δu=+2, α=1+α2 (where α2>α1 and 0<α2<1). If Δu=-1, α=1-α1. If Δu=-2, α1=1-α2.

If the current temperature is denoted by t(T0), temperature in the period T1 is denoted by t(T1), and a difference between the current temperature and the temperature in the period T1 is denoted by Δt=t(T1)-t(T0), the variation coefficient β of temperature is, for example, calculated in the following manner.

If Δt=0, β=1. If Δt>0, β=1+β1. If Δt<0, β=1-β1.

However, β1 is a predetermined value that increases as the absolute value of Δt increases, and satisfies 0<β1<1.

The power amount estimation unit 202 obtains the first estimated power generation in each period by multiplying the current power generation of the solar cell 502 by the power generation coefficient K calculated using the above-described method.

The above-described method for calculating the first estimated power generation is just an example. That is, if the weather conditions in a target period indicate that the amount of sunlight in the target period is expected to be larger than the current amount of sunlight, the power amount estimation unit 202 may correct the current power generation upward while estimating that the amount of sunlight will increase. If the weather conditions in a target period indicate that the amount of sunlight in the target period is expected to be smaller than the current amount of sunlight, the power amount estimation unit 202 may correct the current power generation downward while estimating that the amount of sunlight will decrease.

In S502, the power amount estimation unit 202 calculates the second estimated power generation, which indicates the estimated power generation of the fuel cell 503 in each period, using the state information regarding the fuel cell 503 obtained in S401. The state information regarding the fuel cell 503 includes, for example, information indicating whether the fuel cell 503 is generating power and, if the fuel cell 503 is generating power, information indicating power generation. In addition, it can be assumed that the power generation of the fuel cell 503 does not vary depending on the weather conditions. Therefore, if the state information indicates that the fuel cell 503 is generating power, the power amount estimation unit 202 may obtain the second estimated power generation while assuming that the power generation in each period is the same as the current power generation. On the other hand, if the state information indicates that the state information is not generating power, the power amount estimation unit 202 may obtain the second estimated power generation while assuming that the power generation in each period is 0.

In S503, the power amount estimation unit 202 obtains the power supply information from the electric power company server 200 and calculates, using the obtained power supply information, the estimated amount of external power, which is the estimated amount of power supplied from the electric power company in each period. Here, the power supply information includes, for example, the amount of power that can be supplied, which indicates the amount of power that can be supplied from the electric power company in each period, and a power use rate, which indicates how much of the supplied power is used. The power supply information indicates temporal changes in the amount of power that can be supplied and the power use rate. Therefore, the power amount estimation unit 202 may calculate the estimated amount of external power using a table in which relationships between the amount of power available, the power use rate, and the estimated amount of external power that can be used in each house 500 are calculated in advance. In this case, for example, relationships in which the estimated amount of external power increases as the amount of power that can be supplied increases and the estimated amount of external power decreases as the power use rate decreases may be registered to the table.

Alternatively, the power amount estimation unit 202 may calculate the estimated amount of external power while taking into consideration contract current, which is current available in the corresponding house 500 in a contract with the electric power company. In this case, the power amount estimation unit 202 may calculate the estimated amount of external power using a table in which relationships between the amount of power that can be supplied, the power use rate, the contract current, and the estimated amount of external power are calculated in advance. In this case, for example, relationships in which the estimated amount of external power increases as the amount of power that can be supplied and the contract current increase and the estimated amount of external power decreases as the power use rate increases may be registered to the table.

In S504, the power amount estimation unit 202 calculates the amount of power available by adding the first estimated power generation, the second estimated power generation, and the estimated amount of external power together in each period. For example, if, in the period T1, the first estimated power generation, the second estimated power generation, and the estimated amount of external power are denoted by W1(T1), W2(T1), and W3(T1), respectively, the amount of power available in the period T1 is calculated by W1(T1)+W2(T1)+W3(T1). If, in a period T2, the first estimated power generation, the second estimated power generation, and the estimated amount of external power are denoted by W1(T2), W2(T2), and W3(T2), respectively, the amount of power available in the period T2 is calculated by W1 (T2)+W2 (T2)+W3(T2).

Figure 6:
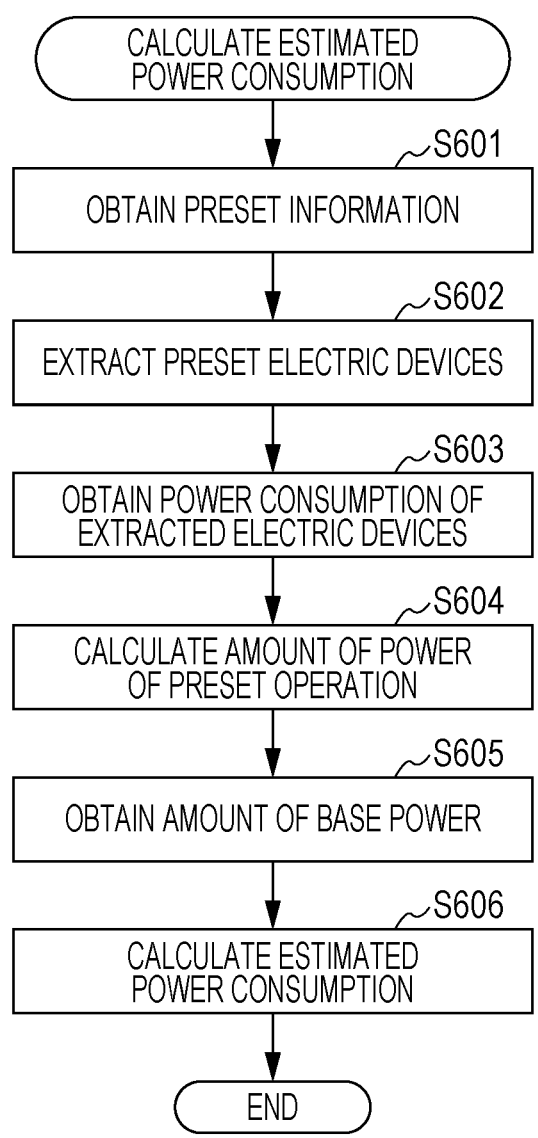
FIG. 6 is a flowchart illustrating an example of a process for calculating estimated power consumption illustrated in FIG. 4.

FIG. 6 is a flowchart illustrating an example of the process for calculating the estimated power consumption illustrated in FIG. 4. First, the power consumption estimation unit 203 obtains preset information regarding a corresponding use from the preset information saving unit 207 (S601). Next, the power consumption estimation unit 203 extracts the electric devices 504 preset in the preset information (S602). For example, if the first air conditioner, the first washing machine, and the first electric kettle are preset in the preset information, the first air conditioner, the first washing machine, and the first electric kettle are extracted.

Next, the power consumption estimation unit 203 obtains the power consumption of the electric devices 504 extracted in S602 from the power consumption information saved in the power consumption information saving unit 209. For example, if the first air conditioner, the first washing machine, and the first electric kettle are extracted in S602, the power consumption estimation unit 203 refers to the power consumption information illustrated in FIG. 10 and obtains the power consumption of the first air conditioner, the first washing machine, and the first electric kettle.

Next, the power consumption estimation unit 203 adds the power consumption of the electric devices 504 preset in each period together to calculate the amount of power of the preset operation, which is the sum of power consumption in each period (S604). For example, if the length of each period is 30 minutes, the first air conditioner and the first washing machine are scheduled in the preset information to operate in a period of 15:00 to 15:30, the temperature of the first air conditioner is set at 28° C., and the first washing machine performs a washing operation, the amount of power of the preset operation in this period is calculated by 90+445 in the example illustrated in FIG. 10. If the first air conditioner, the first washing machine, and the first electric kettle are scheduled in the preset information to operate in a period of 15:30 to 16:00, the temperature of the first air conditioner is set at 28° C., the first washing machine performs a drying operation, and the first electric kettle performs a boiling operation, the amount of power of the preset operation in this period is calculated by 90+1,150+1,100 in the example illustrated in FIG. 10. In other periods, too, the amount of power of the preset operation, which is the sum of the power consumption of the preset electric devices 504, is calculated in the same manner.

Next, the power consumption estimation unit 203 obtains the amount of base power of the house 500 of the corresponding user from the base power amount saving unit 208 (S605). Here, for example, the power consumption estimation unit 203 may save, to a memory, the history of temporal changes in the amount of power consumed when the user is absent from the house 500 and the amount of power consumed in the middle of the night. The power consumption estimation unit 203 may calculate in advance the amount of base power by averaging the power consumption indicated by the history in each period and save the amount of base power to the base power amount saving unit 208. Here, the amount of base power includes the amount of base power in each period of a day, namely, for example, the amount of base power from 0:00 to 0:30, the amount of base power from 0:30 to 1:00, and the amount of base power from 23:30 to 24:00.

Next, the power consumption estimation unit 203 calculates the estimated power consumption by adding the amount of power of the preset operation calculated in S604 and the amount of base power calculated in S605 in each period (S606).

Figure 7:
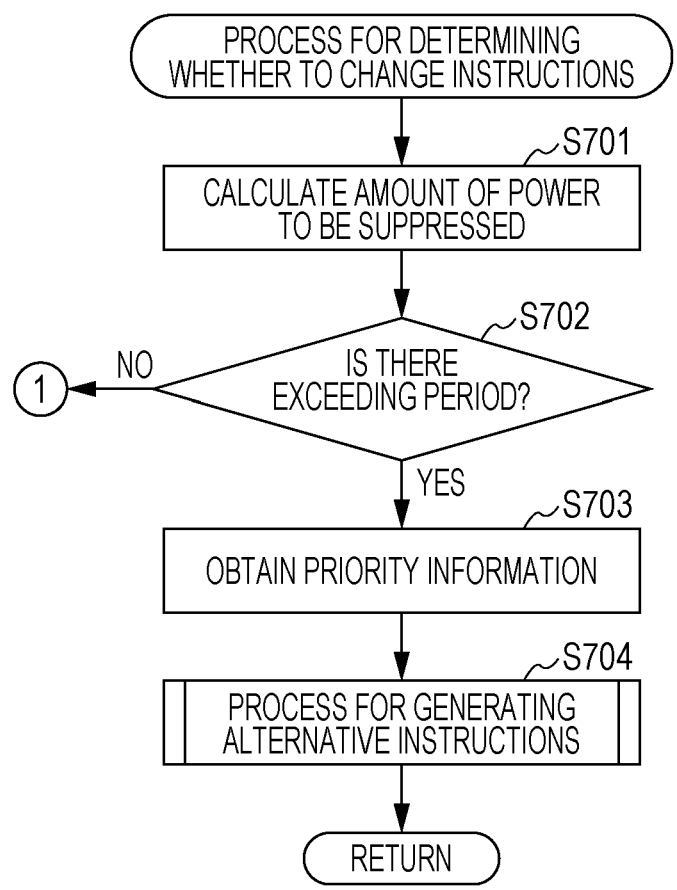
FIG. 7 is a flowchart illustrating an example of a process for determining whether to change instructions illustrated in FIG. 4.

FIG. 7 is a flowchart illustrating an example of the process for determining whether to change the instructions illustrated in FIG. 4. First, the alternative instruction generation unit 204 calculates the amount of power to be suppressed in each period by subtracting the amount of power available from the estimated power consumption (S701).

Next, if there is any period in which the amount of power to be suppressed is larger than 0, the alternative instruction generation unit 204 determines that there is an exceeding period (YES in S702) and causes the process to proceed to S703. If there is no period in which the amount of power to be suppressed is larger than 0, the alternative instruction generation unit 204 determines that there is no exceeding period (NO in S702) and ends the process. If a result of S702 is NO, alternative instructions need not be generated, and therefore the process illustrated in FIG. 4 ends.

In S703, the alternative instruction generation unit 204 obtains the priority information from the priority information saving unit 210. Next, the alternative instruction generation unit 204 performs a process for generating alternative instructions (S704).

Figure 8:
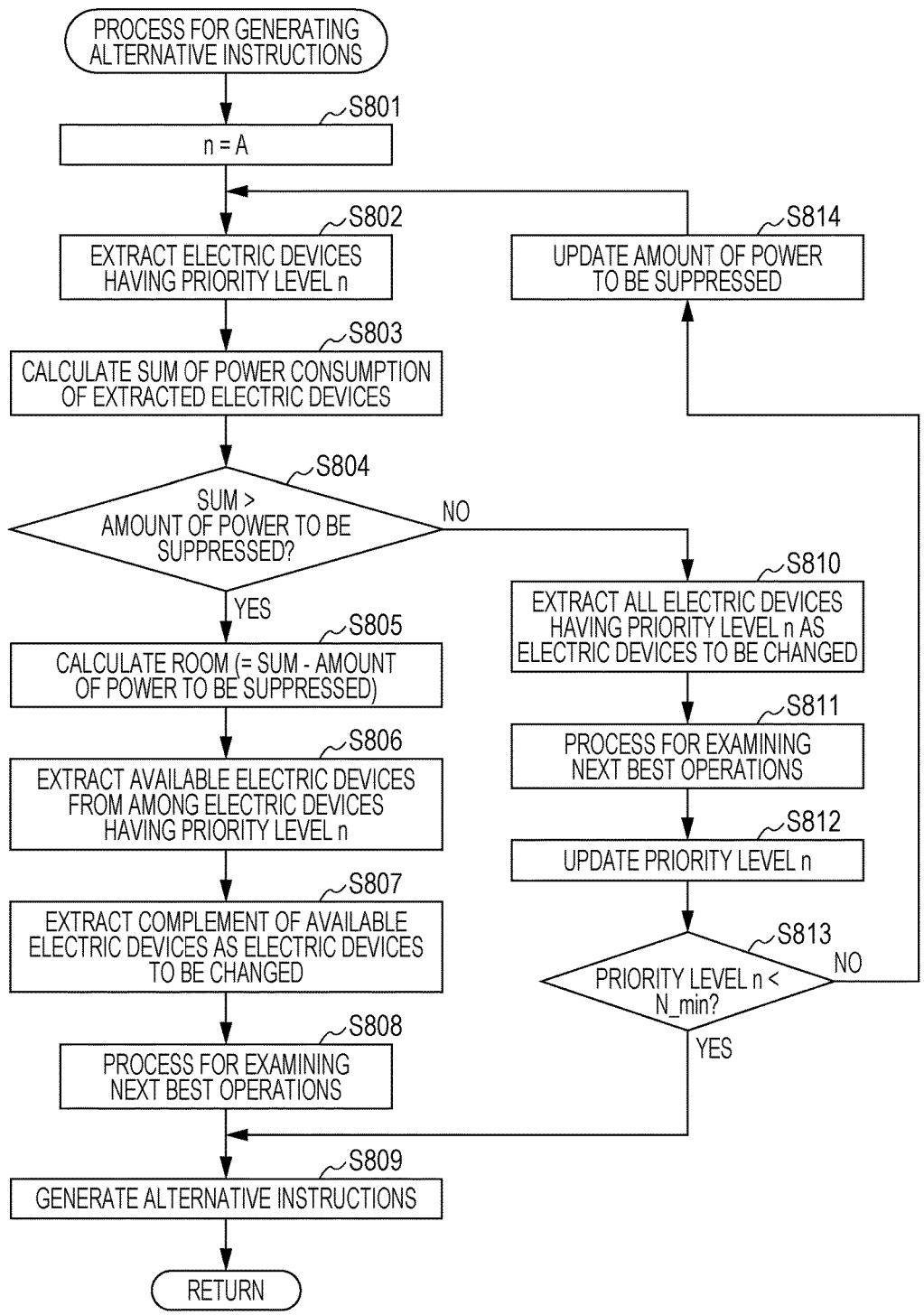
FIG. 8 is a flowchart illustrating an example of a process for generating alternative instructions.

FIG. 8 is a flowchart illustrating an example of the process for generating alternative instructions. First, the alternative instruction generation unit 204 sets a priority level n to A, which indicates a highest priority level (S801).

Figure 18:
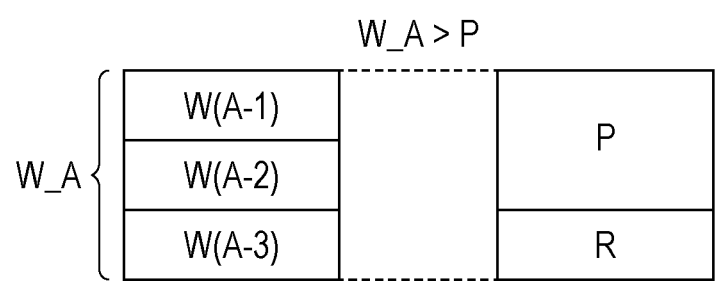
FIG. 18 is a schematic diagram illustrating an example of a relationship between the sum of the power consumption of electric devices having a priority level A and the amount of power to be suppressed at a time when the sum is larger than the amount of power to be suppressed in a certain exceeding period.

Next, the alternative instruction generation unit 204 extracts electric devices 504 having the priority level n in each exceeding period (S802). FIG. 18 is a schematic diagram illustrating a relationship between a sum W_A of the power consumption of the electric devices 504 having the priority level A and an amount of power to be suppressed P in an exceeding period CT1 at a time when the sum W_A is larger than the amount of power to be suppressed P. In the example illustrated in FIG. 18, electric devices 504, namely electric devices A-1, A-2, and A-3, are scheduled to operate in the exceeding period CT1. Therefore, in S802, the electric devices A-1, A-2, and A-3 are extracted.

Next, the alternative instruction generation unit 204 extracts the power consumption of the electric devices 504 having the priority level n extracted in S802 from the power consumption information illustrated in FIG. 10 and calculates the sum of the extracted power consumption in each exceeding period (S803). Because, in the example illustrated in FIG. 18, the power consumption of the electric devices A-1, A-2, and A-3 is denoted by W(A-1), W(A-2), and W(A-3), respectively, the sum W_A is calculated as W_A=W(A-1)+W(A-2)+W(A-3). Here, the sum of the power consumption of the electric devices 504 having the priority level A extracted in the exceeding period CT1 corresponds to an example of a first sum.

Next, if the sum calculated in S803 exceeds the amount of power to be suppressed (YES in S804), the alternative instruction generation unit 204 subtracts the amount of power to be suppressed from the sum to calculate room in each exceeding period (S805). Since the sum W_A exceeds the amount of power to be suppressed P (W_A>P) in the example illustrated in FIG. 18, room R is calculated as R=W_A−P.

Figure 19:
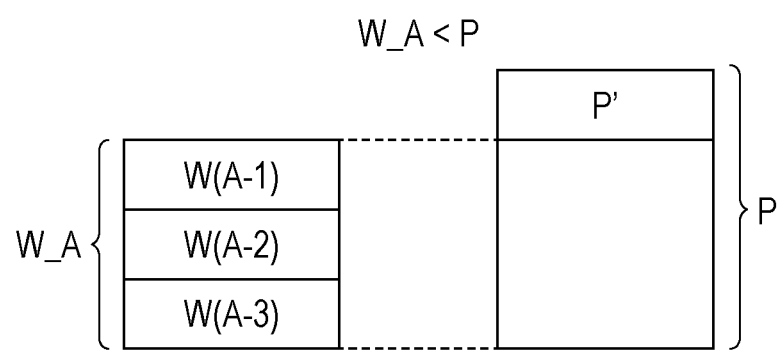
FIG. 19 is a schematic diagram illustrating a relationship between the sum of the power consumption of the electric devices having the priority level A and the amount of power to be suppressed at a time when the sum is smaller than or equal to the amount of power to be suppressed in the certain exceeding period.

On the other hand, if the sum calculated in S803 does not exceed the amount of power to be suppressed (NO in S804), the alternative instruction generation unit 204 causes the process to proceed to S810. FIG. 19 is a schematic diagram illustrating a relationship between the sum W_A of the power consumption of the electric devices 504 having the priority level A and the amount of power to be suppressed P in the exceeding period CT1 at a time when the sum W_A is smaller than or equal to the amount of power to be suppressed P. Because the sum W_A is smaller than the amount of power to be suppressed P in the example illustrated in FIG. 19, the result of S804 is NO.

In S806, the alternative instruction generation unit 204 extracts available electric devices from among the extracted electric devices 504 having the priority level n in each exceeding period. Here, for example, the alternative instruction generation unit 204 extracts, from among the extracted electric devices 504 having the priority level n, one or more electric devices 504 whose power consumption is smaller than the room as the available electric devices. The available electric devices refer to electric devices 504 for which instructions are not to be changed.

In the example illustrated in FIG. 18, first, the alternative instruction generation unit 204 extracts, from among the electric devices A-1, A-2, and A-3, an electric device 504 whose power consumption is lower than the room R. For example, if the power consumption W(A-1) and W(A-2) of the electric devices A-1 and A-2, respectively, are lower than the room R, the electric devices A-1 and A-2 are extracted.

The alternative instruction generation unit 204 then extracts, from among the extracted electric devices 504, one or more electric devices 504 with which the sum of power consumption becomes largest but smaller than or equal to the room R and determines the extracted electric devices 504 as the available electric devices. For example, if, in the example illustrated in FIG. 18, W(A-1)+W(A-2) is smaller than the room R, the electric devices A-1 and A-2 are determined as the available electric devices. If W(A-1)+W(A-2) is equal to or larger than the room R, W(A-1) and W(A-2) are compared with each other, and the electric device A-1 or the electric device A-2, whichever power consumption is higher, is determined as the available electric device.

Although one or more electric devices 504 with which the sum of power consumption becomes largest but smaller than or equal to the room R are extracted here, how electric devices 504 are extracted is not limited to this. A combination of electric devices 504 that rank at or above a certain place (for example, a second place) in terms of power consumption and with which the sum of power consumption is smaller than or equal to the room R may be extracted, and an available electric device may be determined in each combination, instead.

Next, the alternative instruction generation unit 204 determines, among the electric devices 504 having the priority level n, a complement of the available electric devices as electric devices to be changed (S807). Here, the electric devices to be changed refer to electric devices 504 for which instructions are to be changed. If, in the example illustrated in FIG. 18, the electric devices A-1 and A-2 have been determined as the available electric devices, the electric device A-3 is determined as the electric device to be changed. If, in the example illustrated in FIG. 18, the electric device A-1 has been determined as the available electric device, the electric devices A-2 and A-3 are determined as the electric devices to be changed.

If the available electric device has been determined in each combination, the electric device to be changed may be determined in each combination.

Thus, from among the electric devices 504 having the priority level A, electric devices 504 with which the sum of power consumption does not exceed the room R are extracted as the available electric devices. Therefore, the sum of the power consumption of the electric devices to be changed, which are the complement of the available electric devices, is larger than the amount of power to be suppressed P. By changing or canceling the instructions given to the electric devices to be changed such that the electric devices to be changed do not operate in the exceeding period CT1, the amount of power to be suppressed in the exceeding period CT1 can be reduced to 0.

Next, the alternative instruction generation unit 204 performs a process for examining the next best operations of the extracted electric devices to be changed (S808). Here, the alternative instruction generation unit 204 examines the next best operations of, among the electric devices to be changed, electric devices 504 to which the next best operations are registered in the priority information (FIG. 11) and cancels the instructions given to electric devices 504 to which canceling of the instructions is registered without examining the next best operations.

For example, if the electric device to be changed is the first washing machine illustrated in FIG. 11, the instruction given to the first washing machine is changed such that the first washing machine operates before an exceeding period, since "accelerated operation before the peak" is registered to the first washing machine as the next best operation.

Next, the alternative instruction generation unit 204 generates alternative instructions (S809). In S809, if the result of S804 is YES, the alternative instruction generation unit 204 generates alternative instructions to cancel all the instructions given to the electric devices to be changed extracted in S807 as the first alternative instructions. The alternative instruction generation unit 204 generates the second alternative instructions using results of the examination of the next best operations performed in S808. Processing performed in S809 when the result of S804 has been NO will be described later.

If it is determined in S804 that the sum of the power consumption of the electric devices 504 having the priority level n calculated in each period in S803 is smaller than or equal to the amount of power to be suppressed (NO in S804), the alternative instruction generation unit 204 extracts all the electric devices 504 having the priority level n as the electric devices to be changed (S810). As illustrated in FIG. 19, if the sum W_A (=W(A-1)+W(A-2)+W(A-3)) of the power consumption of the electric devices A-1, A-2, and A-3 having the priority level A in the exceeding period CT1 is smaller than or equal to the amount of power to be suppressed P, the amount of power to be suppressed P cannot be reduced to 0 even if all the instructions given to the electric device A-1, A-2, and A-3 are canceled. Therefore, the alternative instruction generation unit 204 extracts all the electric devices A-1, A-2, and A-3 as the electric devices to be changed in order to reduce the amount of power to be suppressed P as much as possible.

Next, as in S808, the alternative instruction generation unit 204 performs the process for examining the next best operations on the electric devices to be changed extracted in S810.

Next, the alternative instruction generation unit 204 lowers the current priority level n by one step to update the priority level n (S812). For example, if the priority level n is set at A, the priority level n is updated to B.

Next, if the priority level n is lower than a minimum value N_min (YES in S813), the process proceeds to S809, and if the priority level n is equal to or higher than the minimum value N_min (NO in S813), the process proceeds to S814. If A and B are defined as the priority levels n, the minimum value N_min is B. Therefore, if the priority level n is set at C in S812, a result of S813 is YES, and if the priority level n is set at B in S813, the result of S813 is NO.

In S814, the alternative instruction generation unit 204 updates the amount of power to be suppressed and returns the process to S802 to perform the processing in S802 and later. In the example illustrated in FIG. 19, an amount of power to be suppressed P' obtained by subtracting the sum W_A of the power consumption of the electric devices A-1, A-2, and A-3 having the priority level A from the current amount of power to be suppressed P is calculated as the updated amount of power to be suppressed. In S804, the amount of power to be suppressed P' is compared with the sum of the power consumption of the electric devices 504 having the priority level B, and if the sum is larger than the amount of power to be suppressed P', the result of S804 is YES, and the processing in S805 and later is performed on the electric devices 504 having the priority level B. If the sum is smaller than or equal to the amount of power to be suppressed P', the result of S804 is NO, and the processing in S810 and later is performed on the electric devices 504 having the priority level B.

The processing performed in S809 when the result of S804 in a first loop has been NO and the result of S804 in a second loop has been YES will be described. In this case, alternative instructions to cancel the instructions given to all the electric devices 504 having the priority level A extracted in S810 as the electric devices to be changed and the instructions given to the electric devices 504 having the priority level B extracted in S807 as the electric devices to be changed are generated as the first alternative instructions. In addition, the second alternative instructions are generated using results of the examination of the next best operations of the electric devices 504 having the priority level A performed in S811 and results of the examination of the next best operations of the electric devices 504 having the priority level B performed in S808.

Next, the processing performed in S809 when A and B have been defined as the levels of priority, the result of S804 in the first loop has been NO, and the result of S804 in the second loop has been NO will be described. In this case, alternative instructions to cancel the instructions given to all the electric devices 504 having the priority level A extracted in S810 in the first loop as the electric devices to be changed and the instructions given to the electric devices 504 having the priority level B extracted in S810 in the second loop as the electric devices to be changed are generated as the first alternative instructions. In addition, the second alternative instructions are generated using results of the examination of the next best operations of the electric devices 504 having the priority level A performed in S811 in the first loop and results of the examination of the next best operations of the electric devices 504 having the priority level B performed in S811 in the second loop.

Next, a specific example of the process for generating alternative instructions will be described. FIG. 12 illustrates a diagram including the example of the preset information and the example of the priority information. FIG. 13 illustrates a diagram including exceeding periods and the amount of power to be suppressed in each period. A specific example of the process for generating alternative instructions will be described with reference to FIGS. 12 and 13. In FIG. 12, the information registered as the target device IDs and the operation times in the preset information illustrated in FIG. 9 are stored as the target device IDs and the operation times. In addition, in FIG. 12, the information registered as the power consumption in the power consumption information illustrated in FIG. 10 is stored as the power consumption. In addition, in FIG. 12, the information registered as the priority and the next best operations in the priority information illustrated in FIG. 11 is stored as the priority and the next best operations.

As illustrated in FIG. 13, in this specific example, the amount of power to be suppressed in periods of 15:00 to 15:30, 15:30 to 16:00, and 16:00 to 16:30 is 1,800 W, 1,000 W, and 800 W, respectively. Since the amount of power to be suppressed is larger than 0, these three periods are extracted as exceeding periods.

FIG. 14 is a diagram illustrating an example of the process for generating alternative instructions in the period of 15:00 to 15:30. In FIG. 14, numbers beginning with an "S" illustrated in a left part of FIG. 14 correspond to the step numbers beginning with an "S" illustrated in FIG. 8. This also holds in FIGS. 15 and 16.

In the period of 15:00 to 15:30, as illustrated in FIG. 12, the preset electric devices 504 having the priority level A are the second air conditioner and the first washing machine. Therefore, in S802, the second air conditioner and the first washing machine are extracted.

Here, the first washing machine performs the drying operation in the period of 15:00 to 15:30. This is because the instruction given to the first washing machine causes the first washing machine to begin the drying operation at 15:00. Therefore, in S803, the sum of the power consumption of the electric devices 504 extracted in S802 is the sum of the power consumption of the second air conditioner and the power consumption of the first washing machine during the drying operation. That is, in S803, the sum of the power consumption of the electric devices 504 extracted in S802 is calculated as 550+1,150=1,700 (W).

In S804, since the sum of power consumption, namely 1,700 W, is smaller than the amount of power to be suppressed in the period of 15:00 to 15:30, namely 1,800 W, the result of S804 is NO. The process proceeds to S810.

In S810 (first loop), all the preset electric devices 504 having the priority level A in the period of 15:00 to 15:30, that is, the second air conditioner and the first washing machine, are determined as the electric devices to be changed.

In S811 (first loop), the next best operations of the second air conditioner and the first washing machine are examined. As illustrated in FIG. 12, as the next best operations, canceling of the instruction is registered to the second air conditioner and an accelerated operation before the peak is registered to the first washing machine. Therefore, canceling of the instruction given to the second air conditioner and the accelerated operation of the first washing machine are examined. In this case, an alternative instruction to begin the washing operation at 12:20 so that the drying operation ends before 15:00, at which the exceeding period begins, is determined for the first washing machine. In addition, an alternative instruction to cancel the instruction given to the second air conditioner is determined for the second air conditioner.

Next, the sum of the power consumption of the second air conditioner and the first washing machine, namely 1,700 W, is subtracted from the amount of power to be suppressed, namely 1,800 W, to update the amount of power to be suppressed. In this case, the amount of power to be suppressed is updated to 1,800−1,700=100 (W).

Next, the sum of the power consumption of the preset electric devices 504 having the priority level B in the period of 15:00 to 15:30 is calculated. Since the first air conditioner is extracted, the sum of the power consumption of the electric device 504 having the priority level B is 90 W. Since the sum, namely 90 W, is smaller than the amount of power to be suppressed, namely 100 W, the result of S804 is NO. Therefore, the processing in S810 (second loop) is performed.

In S810 (second loop), since the preset electric device 504 having the priority level B in the period of 15:00 to 15:30 is the first air conditioner, the first air conditioner is determined as the electric device to be changed.

In S811 (second loop), the next best operation is examined for the first air conditioner. As illustrated in FIG. 12, as the next best operation, an accelerated operation before the peak is registered to the first air conditioner. Therefore, as the next best operation, the accelerated operation of the first air conditioner is examined. In this case, as the next best operation, the operation start time of the first air conditioner is accelerated by 30 minutes, which is the length of each period, and the operation of the first air conditioner temporarily stops at 15:00 in order for the first air conditioner not to operate in the period of 15:00 to 15:30.

In S811 (first loop) and S811 (second loop), the alternative instruction generation unit 204 determines whether the estimated power consumption exceeds the amount of power available in a period to which the operation start time has been accelerated. If the estimated power consumption does not exceed the amount of power available, the alternative instruction generation unit 204 may determine the alternative instruction to accelerate the operation start time as the next best operation. On the other hand, if the estimated power consumption exceeds the amount of power available in the period to which the operation start time has been accelerated, the alternative instruction generation unit 204 may repeat the process for accelerating the operation start time by the length of each period until the estimated power consumption no longer exceeds the amount of power available. If the estimated power consumption still exceeds the amount of power available in a period no matter how many times the operation start time is accelerated, the alternative instruction generation unit 204 may determine that there is no next best operation for the corresponding electric device 504.

In S809, alternative instructions to cancel the instructions given to the electric devices to be changed extracted in S810 (first and second loops) are generated as the first alternative instructions, and the next best operations examined in S811 (first and second loops) are generated as the second alternative instructions. Information including both the instructions is generated as the alternative instructions.

FIG. 15 is a diagram illustrating an example of a process for generating alternative instructions in the period of 15:30 to 16:00.

In the period of 15:30 to 16:00, as illustrated in FIG. 12, the preset electric devices 504 having the priority level A are the second air conditioner, the first washing machine (drying operation), and the first electric kettle (boiling operation). Therefore, in S802, the second air conditioner, the first washing machine, and the first electric kettle are extracted.

Here, in the period of 15:30 to 16:00, the first washing machine performs the drying operation, and the first electric kettle performs the boiling operation. Therefore, in S803, the sum of the power consumption of the electric devices 504 extracted in S802 is the sum of the power consumption of the second air conditioner, the power consumption of the first washing machine during the drying operation, and the power consumption of the first electric kettle during the boiling operation. That is, in S803, the sum of the power consumption of the electric devices 504 extracted in S802 is calculated as 550+1,150+1,100=2,800 (W).

In S804, since the sum of power consumption, namely 2,800 W, is larger than the amount of power to be suppressed in the period of 15:30 to 16:00, namely 1,000 W, the result of S804 is YES. The process proceeds to S805.

In S805, the power to be suppressed, namely 1000 W, is subtracted from the sum of power consumption, namely 2,800 W, to calculate the room, which is 1,800 W.

In S807, first, electric devices 504 whose power consumption is smaller than the room, namely 1,800 W, are extracted from among the electric devices 504 extracted in S802. Here, since the power consumption of the second air conditioner, the first washing machine, and the first electric kettle is lower than the room, these three electric devices 504 are extracted. Next, a combination of electric devices 504 with which the sum of power consumption does not exceed the room is extracted from among the second air conditioner, the first washing machine, and the first electric kettle. Here, since the sum of the power consumption of the second air conditioner and the first washing machine (drying operation) is 550+1,150=1,700 (W), a combination C1 of the second air conditioner and the first washing machine is extracted as the available electric devices. In addition, since the sum of the power consumption of the second air conditioner and the first electric kettle (boiling operation) is 550+1,100=1,650 (W), a combination C2 of the second air conditioner and the first electric kettle is extracted as the available electric devices. Next, from among the electric devices 504 extracted in S802, the first electric kettle, which is the complement of the combination C1, is extracted as the electric device to be changed of the combination C1, and the first washing machine, which is the complement of the combination C2, is extracted as the electric device to be changed of the combination C2.

In S808, the next best operation of the first electric kettle, which is the electric device to be changed of the combination C1, and the next best operation of the first washing machine, which is the electric device to be changed of the combination C2, are individually examined.

As illustrated in FIG. 12, an accelerated operation before the peak is registered to the first washing machine as the next best operation. Therefore, the accelerated operation of the first washing machine is examined as a first next best operation. In this case, an alternative instruction to cause the first washing machine to start the washing operation at 12:20 so that the drying operation ends before 15:00, at which the exceeding period begins, is determined as the first next best operation.

In addition, an accelerated operation before the peak is registered to the first electric kettle as the next best operation. Therefore, the accelerated operation of the first electric kettle is examined as a second next best operation. In this case, an alternative instruction to cause the first electric kettle to start the boiling operation at 14:45 so that the boiling operation ends before 15:00, at which the exceeding period begins, is determined as the second next best operation.

In S809, an alternative instruction to cancel the instruction given to the first electric kettle extracted in S807 and an alternative instruction to cancel the instruction given to the first washing machine extracted in S807 are generated as the first alternative instructions. In addition, in S809, the first next best operation and the second next best operation determined in S808 are generated as the second alternative instructions.

FIG. 16 is a diagram illustrating an example of a process for generating alternative instructions in the period of 16:00 to 16:30.

In the period of 16:00 to 16:30, as illustrated in FIG. 12, the preset electric devices 504 having the priority level A are the second air conditioner, the first washing machine (drying operation), the first electric kettle (heat-retaining operation), and the bath water heater (heating operation). Therefore, in S802, the second air conditioner, the first washing machine, the first electric kettle, and the bath water heater are extracted.

Here, in the period of 16:00 to 16:30, the temperature of the second air conditioner is set at 28° C., the first washing machine performs the drying operation, the first electric kettle performs the heat-retaining operation, and the bath water heater performs the heating operation. Therefore, in S803, the sum of the power consumption of the electric devices 504 extracted in S802 is the sum of the power consumption of the second air conditioner, the power consumption of the first washing machine during the drying operation, the power consumption of the first electric kettle during the heat-retaining operation, and the power consumption of the bath water heater during the heating operation.

That is, in S803, the sum of the power consumption of the electric devices 504 extracted in S802 is 550+1,150+35+2,000=3,735 (W).

In S804, since the sum of power consumption, namely 3,735 W, is larger than the amount of power to be suppressed in the period of 16:00 to 16:30, namely 800 W, the result of S804 is YES. The process proceeds to S805.

In S805, the amount of power to be suppressed, namely 800 W, is subtracted from the sum of power consumption, namely 3,735 W, to calculate the room, which is 2,935 W.

In S807, first, from among the electric devices 504 extracted in S802, electric devices 504 whose power consumption is smaller than the room, namely 2,935 W, are extracted. Here, since the power consumption of the second air conditioner, the first washing machine, and the first electric kettle is lower than the room, these three electric devices 504 are extracted. Next, a combination of electric devices 504 with which the sum of power consumption does not exceed the room is extracted from among the second air conditioner, the first washing machine, and the first electric kettle. Here, since the sum of the power consumption of the second air conditioner, the first washing machine (drying operation), and the first electric kettle (heat-retaining operation) is 550+1,150+35=1,735 (W), a combination C1 of the second air conditioner, the first washing machine, and the first electric kettle is extracted as the available electric devices. In addition, since the sum of the power consumption of the second air conditioner, the first electric kettle (heat-retaining operation), and the bath water heater (heating operation) is 550+35+2,000=2,585 (W), a combination C2 of the second air conditioner, the first electric kettle, and the bath water heater is extracted as the available electric devices. Next, from among the electric devices 504 extracted in S802, the bath water heater, which is the complement of the combination C1, is extracted as the electric device to be changed of the combination C1, and the first washing machine, which is the complement of the combination C2, is extracted as the electric device to be changed of the combination C2.

In S808, the next best operation of the bath water heater, which is the electric device to be changed of the combination C1, and the next best operation of the first washing machine, which is the electric device to be changed of the combination C2, are individually examined.

As illustrated in FIG. 12, an accelerated operation before the peak is registered to the bath water heater as the next best operation. Therefore, the accelerated operation of the bath water heater is examined as the first next best operation. In this case, an alternative instruction to cause the bath water heater to start the heating operation at 14:15 so that the heating operation ends before 15:00, at which the exceeding period begins, is determined as the first next best operation.

In addition, an accelerated operation before the peak is registered to the first washing machine as the next best operation. Therefore, the accelerated operation of the first washing machine is examined as the second next best operation. In this case, an alternative instruction to cause the first washing machine to start the washing operation at 12:20 so that the drying operation ends before 15:00, at which the exceeding period begins, is determined as the second next best operation.

In S809, an alternative instruction to cancel the instruction given to the bath water heater extracted in S807 and an alternative instruction to cancel the instruction given to the first washing machine extracted in S807 are generated as the first alternative instructions. In addition, in S809, the first next best operation and the second next best operation determined in S808 are generated as the second alternative instructions.

Thus, in the power monitoring system according to this embodiment, whether power saving will be necessary in a period in which electric devices are scheduled to operate is determined in advance, and, if power saving will be necessary, a user can be notified of the necessity in advance. As a result, by changing in advance instructions given to the electric devices, the user can avoid a situation in which the preset electric devices do not operate due to insufficient power.

The techniques in the present disclosure are effective in a technology for monitoring the power of electric devices installed in a building of a user using a cloud server, because whether power saving will be necessary in a period in which the electric devices are scheduled to operate is determined in advance and, if power saving will be necessary, the user is notified of the necessity.

What is claimed is:

1. A method for monitoring power used by a power monitoring system that monitors power demand of electric devices installed in a building, the method comprising:
   receiving, via a communication circuit, preset information that defines periods in which one or more preset electric devices are scheduled to operate;
   calculating, via a processor, an amount of power available, which is an estimated amount of power available in the building in each period;
   calculating, via the processor, estimated power consumption, which is estimated power consumption in the building in each period, using power consumption information, to which power consumption of the electric devices to be preset is registered in advance, and the preset information;
   generating, via the processor, an alternative instruction with which the estimated power consumption becomes lower than or equal to the amount of power available in an exceeding period, the exceeding period being a period in which the estimated power consumption exceeds the amount of power available; and
   displaying, on a display of a terminal apparatus, the alternative instruction.

2. The method according to claim 1,
   wherein the displaying the alternative instruction includes receiving a response indicating whether or not to accept the alternative instruction, and
   wherein, if a response indicating that the alternative instruction is accepted is received, changing the preset information in accordance with the alternative instruction.

3. The method according to claim 1,
   wherein a private generator is provided in the building, and
   wherein the step of calculating the amount of power available includes
      calculating estimated private power generation, which indicates an estimated amount of power generated by the private generator in each period, using state information indicating a power generation state of the private generator,
      calculating an estimated amount of external power, which is an estimated amount of power supplied from an electric power company, using power supply information provided by the electric power company, and calculating the amount of power available by adding the estimated amount of external power to the estimated private power generation.

4. The method according to claim 3,
wherein the private generator includes a solar cell, and
wherein the calculating the amount of power available includes
obtaining state information indicating current power generation of the solar cell and weather information, and
calculating the estimated private power generation using the state information and the weather information.

5. The method according to claim 3,
wherein the private generator includes a fuel cell, and
wherein the calculating the amount of power available includes calculating the estimated private power generation using state information indicating current power generation of the fuel cell.

6. The method according to claim 1,
wherein the calculating the estimated power consumption includes
calculating an amount of power of a preset operation, which is a sum of power consumption of the preset electric devices in each period, using the preset information and the power consumption information, and
calculating the estimated power consumption by adding an amount of base power in each period, which is calculated from an amount of power consumed in the building when a user is absent from the building and an amount of power consumed in the building in middle of night, to the calculated amount of power of the preset operation.

7. The method according to claim 1,
wherein priority in changing instructions is determined in advance for the electric devices to be preset, and
wherein the generating the alternative instruction includes
generating the alternative instruction by identifying the exceeding period, and
extracting, for the exceeding period, electric devices for which instructions are to be changed in order of priority until the estimated power consumption becomes lower than or equal to the amount of power available.

8. The method according to claim 7,
wherein the generating the alternative instruction includes
generating a first alternative instruction to cancel a preset operation and a second alternative instruction to move a period of the preset operation to a period other than the exceeding period for the extracted electric devices.

9. The method according to claim 8,
wherein the generating the alternative instruction includes
generating an alternative instruction to move the period of the preset operation as the second alternative instruction for, among the extracted electric devices, an electric device for which movement of the period of the preset operation is permitted in advance, and
generating an alternative instruction to cancel the preset operation as the second alternative instruction for an electric device for which movement of the preset operation is not permitted.

10. The method according to claim 7,
wherein the generating the alternative instruction includes
calculating a first sum, which is a sum of power consumption of first electric devices having a first priority level, the first priority level being a highest priority level in the exceeding period, using the power consumption information, and
if the first sum exceeds an amount of power to be suppressed, which is obtained by subtracting the amount of power available from the estimated power consumption, calculating room, which is obtained by subtracting the amount of power to be suppressed from the first sum, and
performing an extraction process in which one or more first electric devices with which a sum of power consumption is smaller than or equal to the room are extracted using the power consumption information and first electric devices other than the extracted first electric devices are extracted as electric devices for which instructions are to be changed.

11. The method according to claim 10,
wherein the generating the alternative instruction includes
extracting, if the first sum is smaller than or equal to the amount of power to be suppressed, all the first electric devices as electric devices for which instructions are to be changed, the amount of power to be suppressed is updated by subtracting the first sum from the amount of power to be suppressed, and
applying the extraction process to electric devices having a second priority level, which is a second highest priority level.

12. A non-transitory tangible recording medium storing a computer-readable computer program for monitoring power demand of electric devices installed in a building, the non-transitory recording medium causing a computer to perform a process comprising:
receiving preset information that defines periods in which one or more preset electric devices are scheduled to operate;
calculating an amount of power available, which is an estimated amount of power available in the building in each period;
calculating estimated power consumption, which is estimated power consumption in the building in each period, using power consumption information, to which power consumption of the electric devices to be preset is registered in advance, and the preset information;
generating an alternative instruction with which the estimated power consumption becomes lower than or equal to the amount of power available in an exceeding period, the exceeding period being a period in which the estimated power consumption exceeds the amount of power available; and
displaying the alternative instruction on a terminal apparatus.

13. A power monitoring apparatus used in a power monitoring system that monitors power demand of electric devices installed in a building, the power monitoring apparatus comprising:
a communication circuit that receives preset information that defines periods in which one or more preset electric devices are scheduled to operate; and
a processor
that calculates an amount of power available, which is an estimated amount of power available in the building in each period;
that calculates estimated power consumption, which is estimated power consumption in the building in each period, using power consumption information, to which power consumption of the electric devices to be preset is registered in advance, and the preset information;

that generates an alternative instruction with which the estimated power consumption becomes lower than or equal to the amount of power available in an exceeding period, the exceeding period being a period in which the estimated power consumption exceeds the amount of power available; and that displays the alternative instruction on a terminal apparatus.

* * * * *